United States Patent
Mizuno et al.

(10) Patent No.: US 7,075,338 B2
(45) Date of Patent: Jul. 11, 2006

(54) LIGHT EMITTING ELEMENT DRIVING CIRCUIT WITH CURRENT MIRROR CIRCUIT

(75) Inventors: Seiichiro Mizuno, Hamamatsu (JP); Takashi Suzuki, Hamamatsu (JP); Tetsuya Taka, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 39 days.

(21) Appl. No.: 10/821,272

(22) Filed: Apr. 9, 2004

(65) Prior Publication Data

US 2004/0195981 A1 Oct. 7, 2004

Related U.S. Application Data

(63) Continuation-in-part of application No. PCT/JP02/10548, filed on Oct. 10, 2002.

(30) Foreign Application Priority Data

Oct. 11, 2001 (JP) ............................ P2001-314405
Mar. 19, 2002 (JP) ............................ P2002-076858

(51) Int. Cl.
*H03K 5/22* (2006.01)
*H01S 3/30* (2006.01)
*G09G 3/32* (2006.01)

(52) U.S. Cl. .................... 327/66; 327/53; 327/543; 372/8; 372/29.02; 345/82; 345/84

(58) Field of Classification Search .............. 372/8, 372/29.02, 29.021; 327/66, 65
See application file for complete search history.

(56) References Cited

U.S. PATENT DOCUMENTS 4,751,524 A * 6/1988 Balchunas .................. 347/247

(Continued)

FOREIGN PATENT DOCUMENTS

EP 0909973 4/1999

(Continued)

OTHER PUBLICATIONS

Nagahori et al.; "An Analog Front-End Chip Set Employing an Electro-Optical Mixed Design on SPICE for 5-Gb/s/ch Parallel Optical Interconnection"; IEEE Journal of Solid-State Circuits, vol. 36, No. 12, Dec. 2001; pp. 1984-1991.

*Primary Examiner*—Tuyet Thi Vo
(74) *Attorney, Agent, or Firm*—Drinker Biddle & Reath LLP

(57) ABSTRACT

A light emitting element driving circuit for supplying driving current I2 to a light emitting element 10 connected to one line 2 of a current mirror circuit 12 is equipped with a pulse generating circuit 20 connected to the other line 1 so that pulse current flows therethrough, and superposing means 30 for superposing a first auxiliary pulse current on the pulse current in synchronization with the rise-up time of the pulse current. The rise-up time is shortened by the superposition. In the driving circuit, a source follower circuit is connected to the current mirror circuit, and current flowing through the source follower circuit is set to be substantially proportional to current flowing through the other line of the current mirror circuit.

10 Claims, 19 Drawing Sheets

U.S. PATENT DOCUMENTS

| | | | | |
|---|---|---|---|---|
| 5,349,595 A | * | 9/1994 | Ogawa et al. | 372/38.02 |
| 5,898,334 A | | 4/1999 | Fairgrieve | 37/411 |
| 6,587,489 B1 | * | 7/2003 | Schrodinger | 372/29.01 |
| 6,826,215 B1 | * | 11/2004 | Tsuji et al. | 372/38.02 |

FOREIGN PATENT DOCUMENTS

| | | |
|---|---|---|
| JP | 58-182144 | 10/1983 |
| JP | 63-67791 | 3/1988 |
| JP | 63-251945 | 10/1988 |
| JP | 6-45675 | 2/1994 |
| JP | A 6 045675 | 2/1994 |
| JP | 9-83442 | 3/1997 |
| JP | A-9 083 442 | 3/1997 |
| JP | 11-40855 | 2/1999 |
| JP | 2000-252756 | 9/2000 |
| JP | 2001-36187 | 2/2001 |
| JP | 2002-64433 | 2/2002 |

* cited by examiner

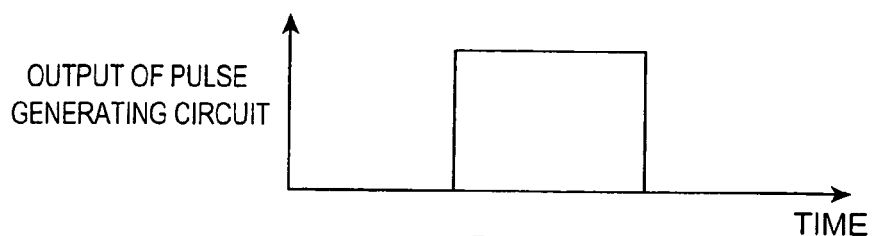
Fig.4A  OUTPUT OF PULSE GENERATING CIRCUIT
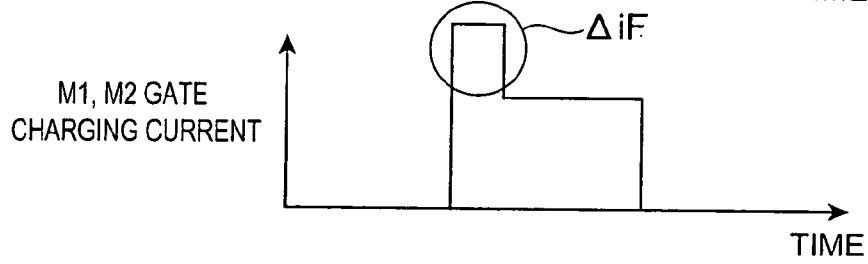
Fig.4B  M1, M2 GATE CHARGING CURRENT
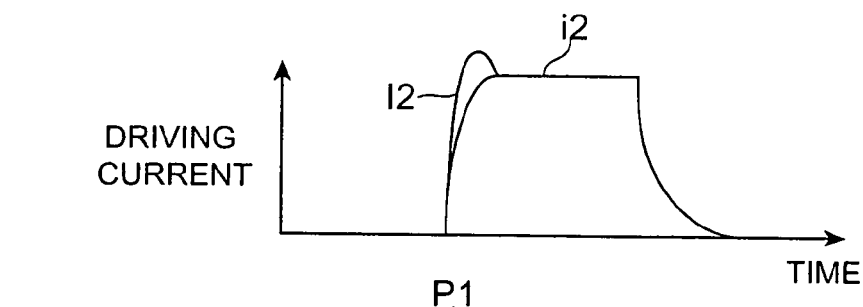
Fig.4C  DRIVING CURRENT
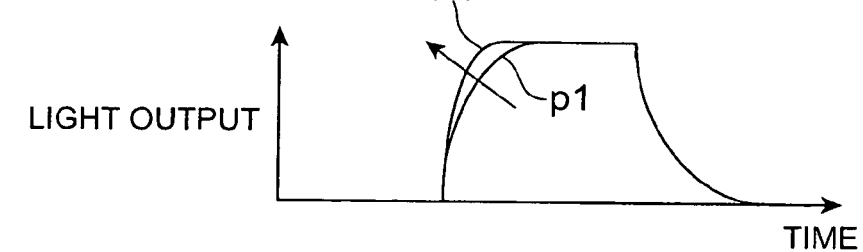
Fig.4D  LIGHT OUTPUT

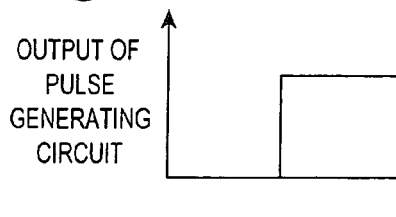

Fig.7A OUTPUT OF PULSE GENERATING CIRCUIT / TIME

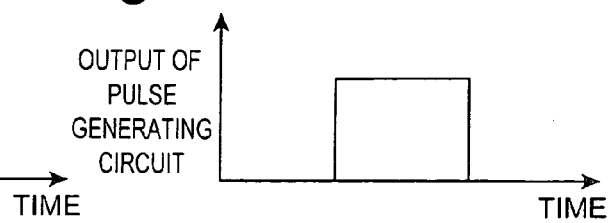

Fig.7E OUTPUT OF PULSE GENERATING CIRCUIT / TIME

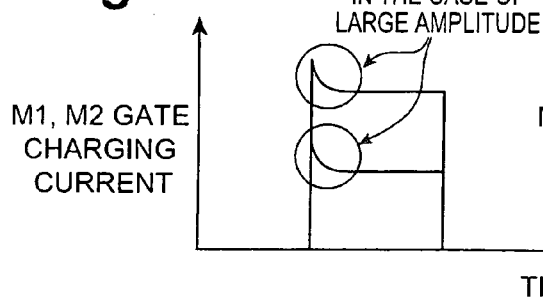

Fig.7B M1, M2 GATE CHARGING CURRENT / TIME — SAME LEVEL EFFECT EVEN IN THE CASE OF LARGE AMPLITUDE

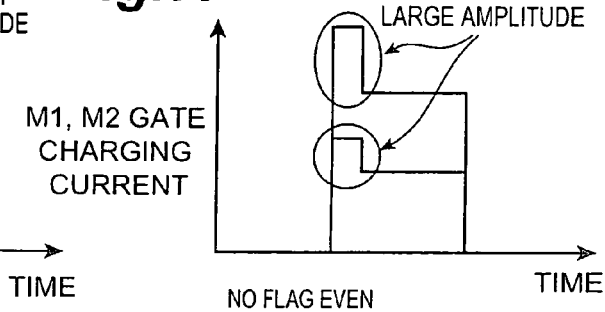

Fig.7F M1, M2 GATE CHARGING CURRENT / TIME — EFFECT IS PROPORTIONAL EVEN IN THE CASE OF LARGE AMPLITUDE

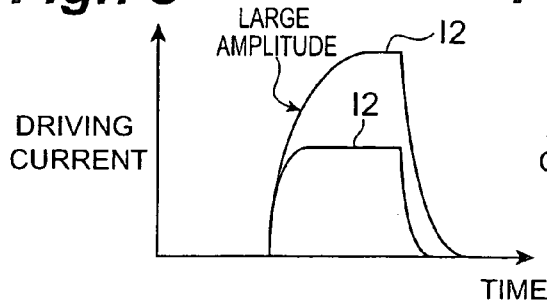

Fig.7C DRIVING CURRENT / TIME — FLAGS IN THE CASE OF LARGE AMPLITUDE (I2)

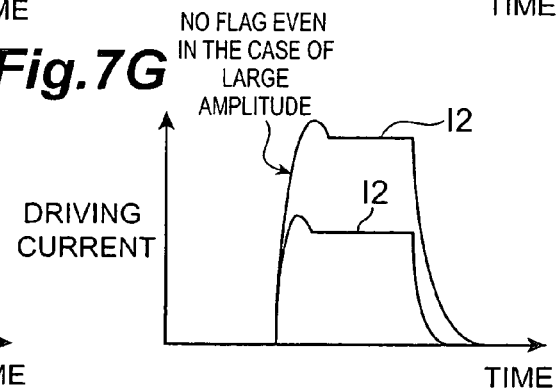

Fig.7G DRIVING CURRENT / TIME — NO FLAG EVEN IN THE CASE OF LARGE AMPLITUDE (I2)

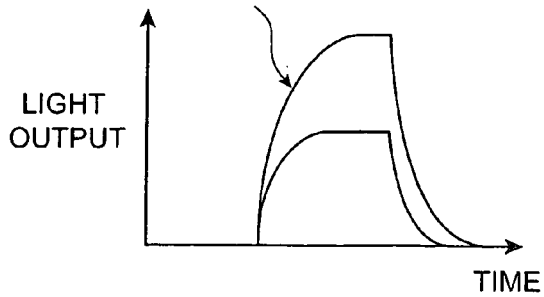

Fig.7D LIGHT OUTPUT / TIME — FLAGS IN THE CASE OF LARGE AMPLITUDE

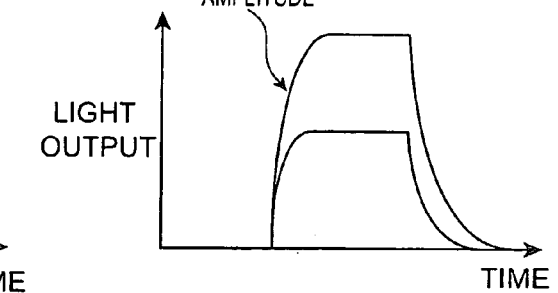

Fig.7H LIGHT OUTPUT / TIME — NO FLAG EVEN IN THE CASE OF LARGE AMPLITUDE

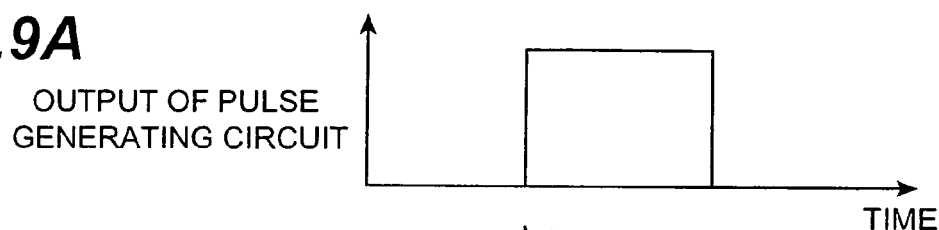
Fig.9A OUTPUT OF PULSE GENERATING CIRCUIT
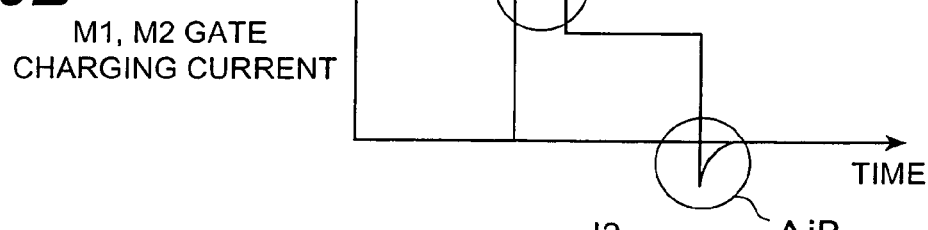
Fig.9B M1, M2 GATE CHARGING CURRENT
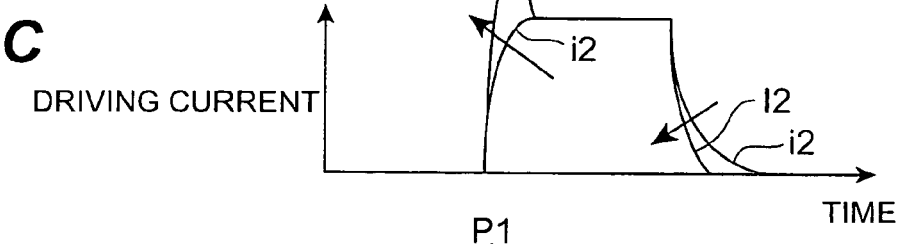
Fig.9C DRIVING CURRENT
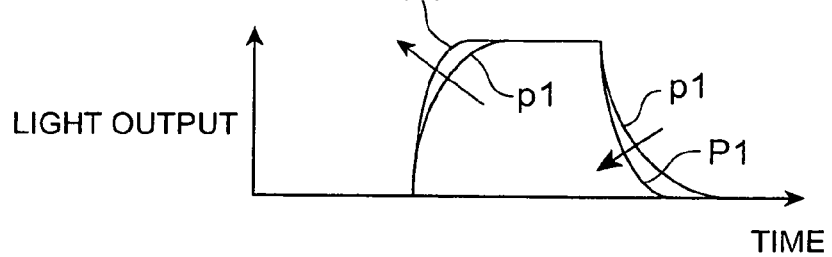
Fig.9D LIGHT OUTPUT

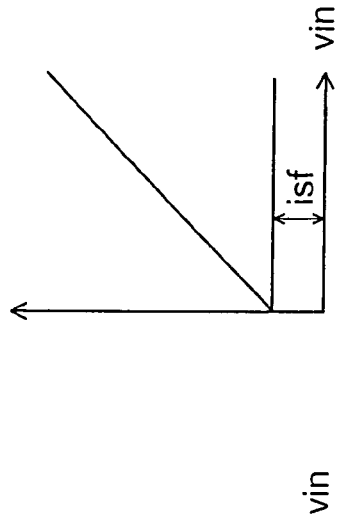
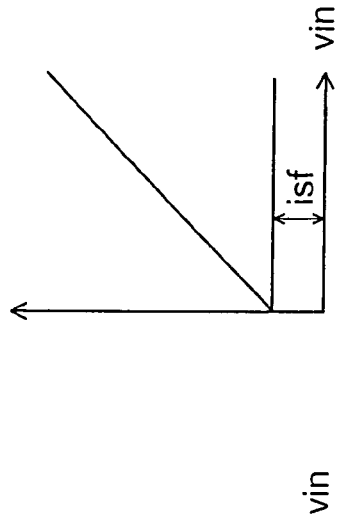
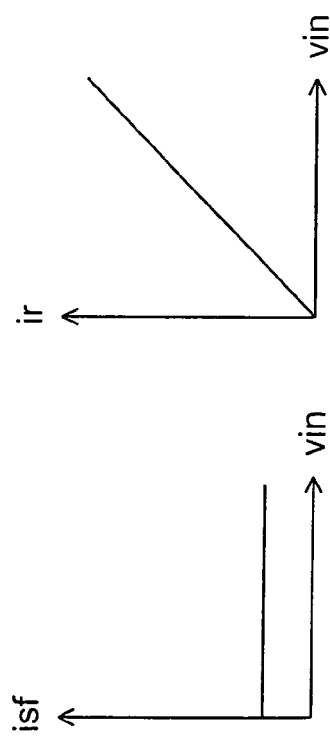
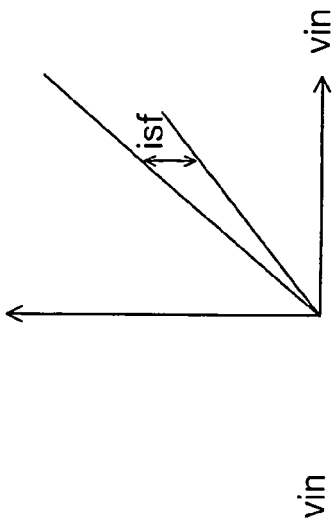
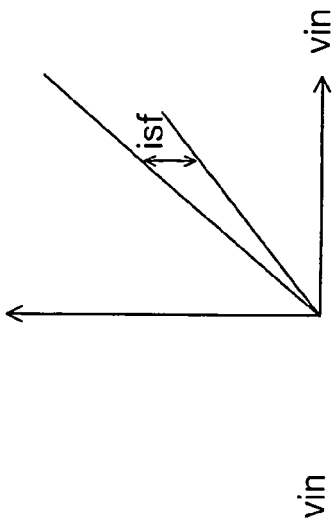
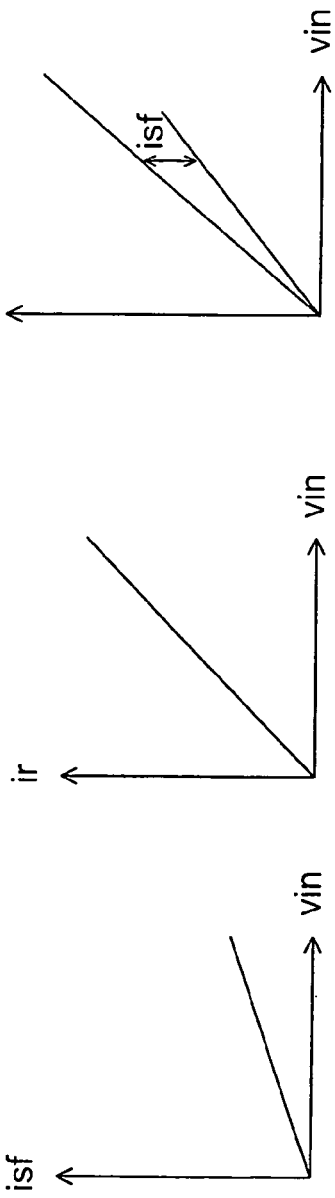

LIGHT EMITTING ELEMENT DRIVING CIRCUIT WITH CURRENT MIRROR CIRCUIT

RELATED APPLICATION

This is a Continuation-In-Part application of international application PCT/JP02/10548 filed Oct. 10, 2002.

BACKGROUND OF THE INVENTION

1. Field of the Invention

The present invention relates to a light emitting element driving circuit.

2. Related Background Art

It has been generally carried out to write information into a storage medium such as a CD-R, CD-RW, etc., by driving a light emitting element such as a laser diode, etc. In order to shorten this writing time, the width of pulses for driving the light emitting element must be shortened.

SUMMARY OF THE INVENTION

When the pulse width for driving the light emitting element is shortened, the amount of light to be irradiated to a predetermined place of a storage medium per unit time is reduced in connection with the reduction of the pulse width. Accordingly, it is necessary to increase the intensity of light emitting per unit time in order to perform a high-speed pulse driving operation.

In order to increase the emitting light intensity, driving current for the light emitting element may be increased. However, in this case, large-size transistors, wires, etc., are required, and thus the parasitic capacitance in the driving circuit is increased. The increase of the parasitic capacitance lengthens the pulse rise-up time or falling time, so that the effective pulse width is increased. As described above, in the conventional light emitting element driving circuit as described above, there is a restriction on the high-speed driving operation under the state where the emitting light intensity of the light emitting element is enhanced.

Of course, there is a method for supplying weak DC current to the light emitting element in advance to shorten the rise-up time of the pulses. However, such a method does not provide a drastic improvement.

The present invention has been implemented in view of the above problem, and has an object to provide a light emitting element driving circuit which can drive a light emitting element at high speed.

In order to solve the above problem, according to the present invention, a light emitting element driving circuit for supplying driving current to a light emitting element connected to one line of a current mirror circuit having two parallel lines, is characterized by comprising: a pulse generating circuit connected to the other line so that pulse current flows through the other pulse; and superposing first auxiliary pulse current on the pulse current in synchronization with the rise-up time of the pulse current.

It is known that the current mirror circuit comprises two transistors and has two parallel lines. The magnitude of current flowing through one line is coincident with or proportional to the magnitude of current flowing through the other line under a stationary state. Accordingly, if the magnitude of the current flowing through the other line is controlled, the magnitude of the current flowing through the light emitting element connected to the one line can be controlled.

When a predetermined voltage is applied to the control terminal of a transistor, that is, when a predetermined voltage is applied between the base and the emitter in the case of a bipolar transistor or between the source and the gate in the case of an electric field effect transistor, current flows through a transistor connected to the other line, and proportional current flows through the one transistor and thus the driving current is supplied to the light emitting element.

When pulse current flows through the other line by a pulse generating circuit, pulse current is supplied to the light emitting element connected to the one line, and the light emitting element, which is concerned, emits light. In the driving circuit described above, the superposing means superposes the first auxiliary pulse current on the pulse current concerned in synchronization with the rise-up time of the pulse current. In addition to the pulse current, the first auxiliary pulse current flows through the other line of the current mirror circuit. Therefore, the gate-source voltage of the transistor constituting the current mirror circuit is rapidly charged. Accordingly, the current flowing through the one line of the current mirror circuit rises up rapidly. This current is supplied to the light emitting element, and sharp rise-up light emission can be performed.

The pulse generating circuit is connected so that the pulse current flows through the other line of the current mirror circuit. There may be proposed various connections and constructions for this. As one preferable example, a construction may be provided where the pulse generating circuit generates a pulse voltage for controlling a switch connected to the other line of the current mirror circuit in series. In this case, since the concerned switch is switched on/off by the pulse voltage, the pulse current flows through the other line by the switching.

Various constructions may be considered for the superposing means. As one preferable construction, the superposing mean comprises a differentiating current for differentiating a pulse voltage output from the pulse generating circuit and inputting the pulse voltage thus differentiated to the other line of the current mirror circuit, and the first auxiliary pulse current is generated in accordance with the output of the differentiation circuit. When the pulse voltage is differentiated, positive output current and negative output current occur at the rise-up time and falling time of the pulse voltage. This current is set as the first auxiliary pulse current at the rise-up time.

In the light emitting element driving circuit of the present invention, it is preferable that the downstream side of the other line of the current mirror circuit is connected to a current source for defining current flowing through the concerned line. In this case, the maximum value of the current flowing through the concerned line is stabilized by the regulation of the current source, and thus the intensity of the emitting light of the light emitting element is stabilized.

Furthermore, as another preferable example of the construction of the superposing means, a construction where the superposing means comprises a one-shot circuit for outputting one shot pulse voltage in synchronization with the rise-up time of the pulse voltage, and a transistor which has a control terminal supplied with the shot pulse voltage and is connected to the downstream side of the other line of the current mirror circuit may be considered. At the rise-up time of the pulse voltage, the shot pulse voltage is input to the control terminal of the transistor, so that the first auxiliary pulse current flows into the transistor in accordance with the shot pulse voltage and it is superposed on the pulse current described above.

Furthermore, the downstream side of the other line of the current mirror circuit is branched, and one of the branched lines is connected to a first transistor for defining current flowing through the concerned line, and the superposing means comprises a one-shot circuit for outputting a one shot pulse voltage in synchronization with the rise-up time of the pulse voltage, and a second transistor which has a control terminal supplied with the shot pulse voltage and is connected to the downstream side of the other line of the branched lines. A third transistor for defining current flowing through the second transistor is connected to the downstream side of the second transistor, and the control terminals of the first and third transistors are mutually connected to each other.

The control terminals of the first and third transistors are connected to each other. Therefore, when the voltage applied to one control terminal is varied, the voltage applied to the other control terminal is proportionally varied. The first transistor defines the current flowing through the branched line from the other line of the current mirror circuit, that is, main pulse current, and the third transistor defines the auxiliary addition current generated by the shot pulse voltage, that is, the first auxiliary pulse current, so that the main pulse current and the first auxiliary pulse current are varied to maintain a proportional relationship with each other. That is, in this construction, even when the driving current is increased, the first auxiliary pulse current is prevented from being relatively reduced.

The superposing means may superpose negative second auxiliary pulse current on the pulse current in synchronization with the falling time of the pulse current. In this case, the driving current falls sharply.

Oscillation is liable to occur when the light emitting element is driven at high speed. However, if a source follower circuit is connected to one line of the current mirror circuit, oscillation caused by variation of the driving current can be suppressed, and the high-speed driving of the light emitting element can be stably performed.

Furthermore, if a light emitting element driving circuit for supplying driving current to a light emitting element connected to one line of a current mirror circuit having two parallel lines is equipped with a pulse generating circuit, which is connected to the other line so that pulse current flows, and superposing means for superposing the pulse current on auxiliary pulse current in synchronization with the falling time of the pulse current, the falling time of the driving current can shortened.

Still furthermore, it is preferable that the light emitting element driving circuit of the present invention is equipped with a source follower circuit connected to the one line of the current mirror circuit, and a current setting circuit for setting current so that the current flowing through the source follower circuit is substantially proportional to current flowing through the other line of the current mirror circuit. In this case, by merely carrying out the setting in the current setting circuit, the current supplied from the current mirror circuit to the light emitting element and the current supplied from the source follower circuit can be made substantially proportional to each other. That is, when the current supplied from the current mirror circuit to the light emitting element is substantially equal to zero, the current supplied from the source follower circuit to the light emitting element is substantially equal to zero.

Still furthermore, it is preferable that the current setting circuit has a current controlling transistor equipped to the other line of the current mirror circuit, and the transistor and the source follower circuit are connected to each other so that the current source for supplying current to the source follower circuit is controlled by an input to the control terminal of the transistor. In this case, the construction of the circuit is easy.

BRIEF DESCRIPTION OF THE DRAWINGS

FIG. 4A is a timing chart of the output of a pulse generating circuit.

FIG. 4B is a timing chart of M1 and M2 gate charging current.

FIG. 4C is a timing chart showing driving current.

FIG. 4D is a timing chart of a light output.

FIG. 7A is a timing chart of the output of a pulse generating circuit.

FIG. 7B is a timing chart of M1 and M2 gate charging current.

FIG. 7C is a timing chart of driving current.

FIG. 7D is a timing chart of a light output.

FIG. 7E is a timing chart showing the output of a pulse generating circuit.

FIG. 7F is a timing chart of M1 and M2 gate charging current.

FIG. 7G is a timing chart of driving current.

FIG. 7H is a timing chart of a light output.

FIG. 9A is a timing chart showing the output of a pulse generating circuit.

FIG. 9B is a timing chart of M1 and M2 gate charging current.

FIG. 9C is a timing chart of driving current.

FIG. 9D is a timing chart of a light output.

FIG. 19A is a graph showing the relationship between an input voltage vin and an output isf.

FIG. 19B is a graph showing the relationship between an input voltage vin and an output ir.

FIG. 19C is a graph showing the relationship between an input voltage vin and an output iL.

FIG. 19D is a graph showing the relationship between an input voltage vin and an output isf.

FIG. 19E is a graph showing the relationship between an input voltage vin and an output ir.

FIG. 19F is a graph showing the relationship between an input voltage vin and an output iL.

DESCRIPTION OF THE PREFERRED EMBODIMENT

Figure 1:
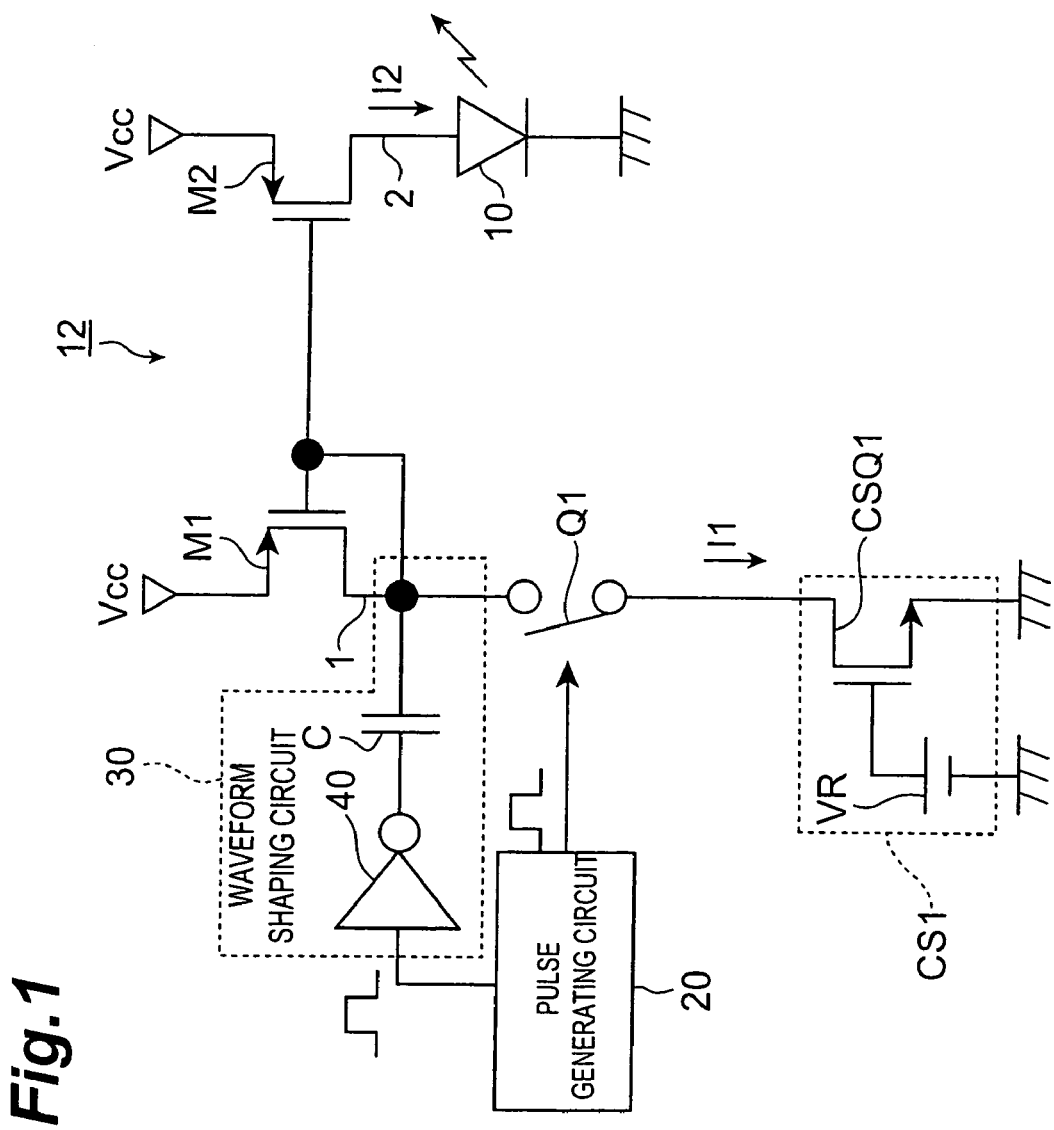
FIG. 1 is circuit diagram showing a light emitting element driving circuit according to a first embodiment.

A light emitting element driving circuit according to the present invention will be described hereunder. The same elements are represented by the same reference numerals, and overlapping description is omitted.

First Embodiment

FIG. 1 is a circuit diagram of a light emitting element driving circuit according to a first embodiment.

Figure 2:
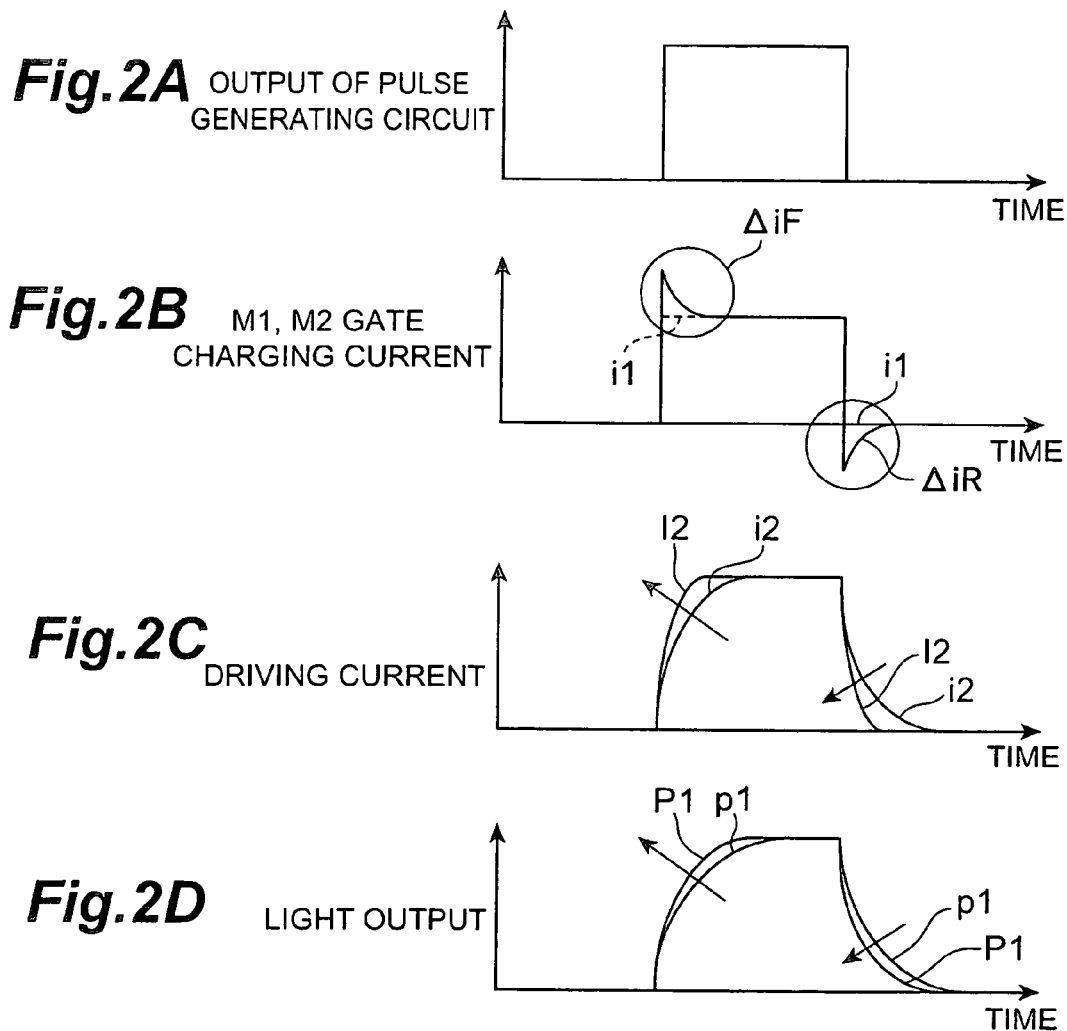
FIG. 2A is a timing chart showing the output of a pulse generating circuit.
FIG. 2B is a timing chart showing M1 and M2 gate charging current.
FIG. 2C is a timing chart showing driving current.
FIG. 2D is a timing chart of a light output.

FIG. 2A is a timing chart of the output of a pulse generating circuit, FIG. 2B is a timing chart of M1 and M2 gate charging current, FIG. 2C is a timing chart of driving current and FIG. 2D is a timing chart of a light output.

The light emitting element driving circuit is equipped with a current mirror circuit 12 having two parallel lines 1 and 2.

It is known that the current mirror circuit 12 comprises two transistors M1 and M2 and has two parallel lines 1 and 2. The magnitude of current flowing through one line 2 is routinely coincident with or proportional to the magnitude of current flowing through the other line 1. Accordingly, when the magnitude of the current I1 flowing through the other line 1 is controlled, the current I2 flowing through the light emitting element 10 connected to the one line 2 can be controlled.

The transistor M1 and M2 of this embodiment comprises p-channel type MOS electric field effect transistor, however, it may be a bipolar transistor.

When a predetermined voltage is applied to the control terminals of the transistors M1 and M2, that is, a predetermined voltage is applied between the base and the emitter in the case of a bipolar transistor or between the source and the gate in the case of an electric field effect transistor, current flows through the transistor M1 connected to the other line 1, and current proportional to the current flowing through the transistor M1 flows through the transistor M2. Accordingly, driving current is supplied to the light emitting element 10. The light emitting element 10 of this embodiment is a laser diode, however, it may be a light emitting diode.

According to this embodiment, the light emitting element driving circuit of this embodiment for supplying the driving current I2 to the light emitting element 10 connected to one line 2 of the current mirror circuit 12 is equipped with a pulse generating circuit 20 connected to the other line 1 so that pulse current flows thereto, and superposing means 30 for superposing first auxiliary pulse current on the pulse current in synchronization with the rise-up time of the pulse current and superposing second auxiliary pulse current on the pulse current in synchronization with the falling time of the pulse current. The first auxiliary pulse current and the second auxiliary pulse current flow in a forward direction and in a reverse direction with respect to a main pulse current flowing through the line 1 before superposition.

When the pulse current flows through the other line 1 by the pulse generating circuit 20, the pulse current is supplied to the light emitting element 10 connected to the one line 2, and the light emitting element 10 emits light. In the driving circuit of this embodiment, the superposing means 30 superposes the first auxiliary pulse current on the pulse current in synchronization with the rise-up time of the pulse current, and superposes the second auxiliary pulse current on the pulse current in synchronization with the falling time of the pulse current.

In addition to the pulse current, the first auxiliary pulse current flows through the other line 1 of the current mirror circuit 12. Furthermore, in addition to the pulse current, the second auxiliary pulse current in the reverse direction flows through the line 1. Accordingly, the control terminals of the transistors used for the current mirror circuit are rapidly charged/discharged, and the current for driving the light emitting element 10 rises up or falls sharply. As a result, the light emitting element 10 carries out sharp rise-up/falling light emission.

The pulse generating circuit 20 is connected to the other line 1 of the current mirror circuit 12 so that the pulse current flows thereto. Various connections and constructions may be considered.

In this embodiment, the pulse generating circuit 20 generates a pulse voltage for controlling a switch (transistor) Q1 connected to the other line 1 of the current mirror circuit 12 in series (FIG. 2A).

In this case, since the switch Q1 concerned is switched on/off by the pulse voltage, the pulse current i1 flows through the other line 1 by this switching operation (FIG. 2B). The drain and gate of the transistor M1 are connected to each other. Under the state where no current flows, the potential of the gate is set to power source potential Vcc, and the capacitance between the gate and the source is charged by the pulse current flowing through the line 1 immediately after the switch Q1 is switched on, and the potential of the gate is gradually reduced to be lower than Vcc. When the switch Q1 is switched off, an inverse operation is carried out, and no current flows in principle.

Here, the principle means as follows. Even when the switch Q1 is under an off-state, a transistor in which weak DC current flows may be adopted. Furthermore, since the switch Q1 is a transistor, by applying a predetermined weak DC voltage to the control terminal of the transistor, the weak DC current can be made to flow through the transistor even when the switch Q1 is kept under an OFF-state.

Various constructions may be also considered for the superposing means 30.

In this embodiment, the superposing means 30 comprises a differentiation circuit for differentiating the pulse voltage output from the pulse generating circuit 20 and inputting the pulse voltage thus differentiated to the other line 1 of the current mirror circuit 12, and the first auxiliary pulse current described above is generated in accordance with the output of the differentiation circuit which is concerned. The differentiation circuit 30 is equipped with a capacitor C between the input and output thereof, and the differentiating operation is carried out by the charging/discharging of the capacitor C and a proper resistor connected to the output side of the capacitor C.

In this embodiment, the output of the pulse generating circuit 20 is shaped in waveform by a waveform shaping circuit 40, and then input to the capacitor C. The waveform shaping circuit 40 of this embodiment is an inverting and amplifying circuit, and converts the level and polarity of the auxiliary pulse current at the superposition time to a desired state. The differentiation circuit 30 may be equipped with a resistor at the downstream side of the node point between the differentiation circuit 30 and the current mirror circuit. However, a transistor located at the downstream side of the node point concerned substantially takes charge of the function of such a resistor.

When the pulse voltage output from the pulse generating circuit 20 is differentiated by the differentiation circuit 30, positive and negative currents occur at the rise-up time and falling time of the pulse voltage. The current at the rise-up time is the first auxiliary pulse current ΔiF, and the negative second auxiliary pulse current ΔiR at the falling time. FIG. 2B is a timing chart showing these auxiliary pulse currents as charging currents to the gates of the transistors M1 and M2.

These auxiliary pulse currents ΔiF and ΔiR are respectively superposed on the pulse current i1 in synchronization with the rise-up time and falling time of the pulse current i1 respectively, so that the rise-up time and the falling time of the pulse current I1 are shortened. The driving current I2 is shown in FIG. 2C, and proportional to the input current I1 flowing through the line 1, so that the rise-up time and falling time of the driving current I2 are shortened. That is, the superposing means 30 superposes the second auxiliary pulse current ΔiR on the pulse current in synchronization with the falling time of the pulse current, and thus the driving current I2 falls sharply.

The rise-up time and falling time of the waveform of the driving current I2 when the superposition is carried out are shortened as compared with the driving current i2 when the superposition as described above is not carried out.

The waveform of the light output of the light emitting element 10 becomes slightly more flagged than the driving current by the time constant of the light emitting element 10 itself, however, the rise-up time and falling time of the waveform of the light output P1 when the superposition is carried out are shortened as compared with the light output p1 when the superposition as described above is not carried out (FIG. 2D).

The downstream side of the other line 1 of the current mirror circuit 12 is connected to a current source CS1 for defining the current flowing through the concerned line. In this case, the constant value of the current I1 flowing through the concerned line 1 is stabilized through the current regulation by the current source CS1, so that the light emission intensity of the light emitting element 10 is stabilized.

The current source CS1 is equipped with a transistor CSQ1 connected between the switch Q1 and the ground, and a voltage source VR connected to the control terminal of the transistor CSQ1. The transistor CSQ1 is an N-channel type MOS electric field effect transistor, and it is set to the source ground. The control terminal thereof is the gate, and thus constant current flows between the drain and source of the transistor by fixing the gate-source voltage of the transistor to a predetermined value with the voltage source VR. The predetermined value may be varied.

Second Embodiment

Figure 3:
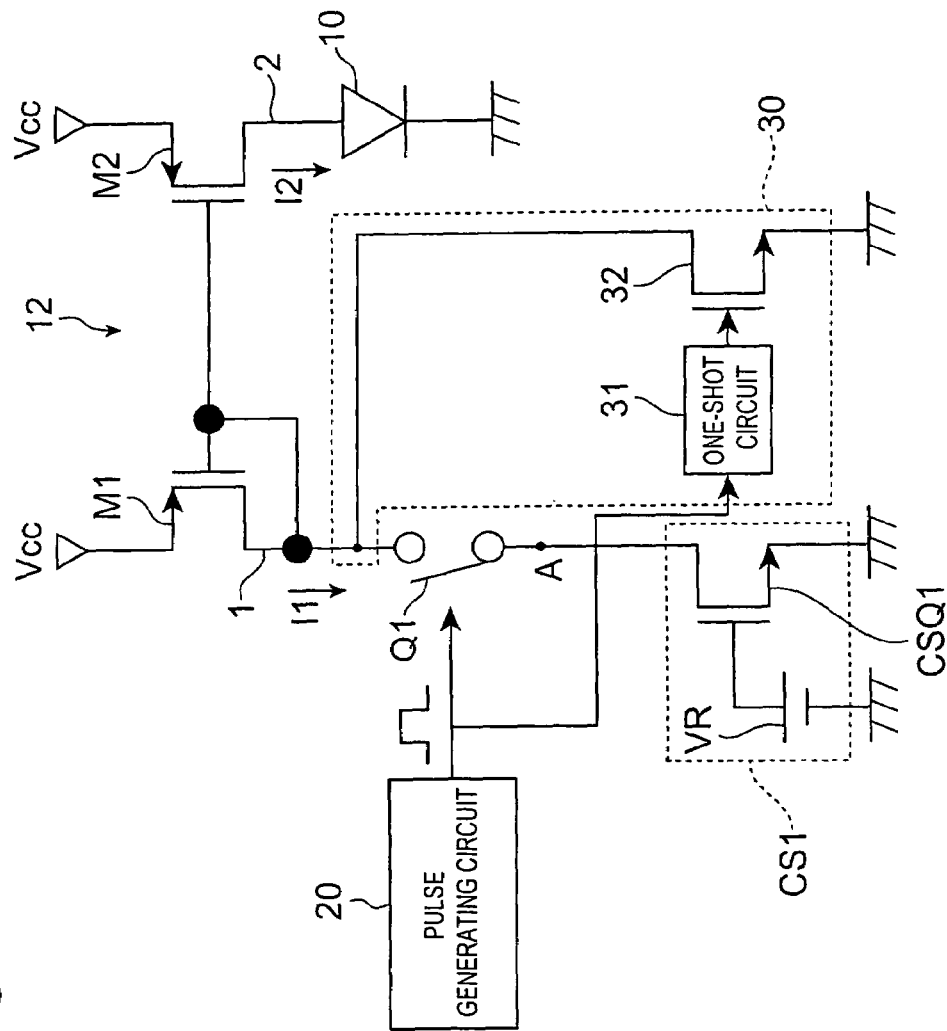
FIG. 3 is a circuit diagram of a light emitting element driving circuit according to a second embodiment.

FIG. 3 is a circuit diagram showing a light emitting element driving circuit according to a second embodiment.

FIG. 4A is a timing chart of the output of the pulse generating circuit, FIG. 4B is a timing chart of M1 and M2 gate charging current, FIG. 4C is a timing chart of driving current, and FIG. 4D is a timing chart of a light output.

This circuit is different from the circuit of the first embodiment only in the construction of the superposing means 30. The superposing means 30 of this embodiment is equipped with a one-shot circuit 31 for outputting one shot pulse voltage in synchronization with the rise-up time of the pulse voltage output from the pulse generating circuit 20, and a transistor 32 which has a control terminal supplied with the shot pulse voltage and is connected to the downstream side of the other line 1 of the current mirror circuit 12.

At the rise-up time of the pulse voltage (FIG. 4A) the shot pulse voltage is input to the control terminal of the transistor 32, so that the first auxiliary pulse current ΔiF flows in the transistor in accordance with the shot pulse voltage and this is superposed on the pulse current described above. FIG. 4B is a timing chart showing the sum of the auxiliary pulse current ΔiF and the pulse current as the charging current to the gates of the transistors M1 and M2.

By the superposing effect of the shot pulse current, the capacitance of the gate of each of the transistors M1 and M2 can be more quickly charged than the case where no shot pulse current is superposed. As a result, the driving current I2 rises up quickly, and thus the light output P1 of the light emitting element 10 has a shorter waveform rise-up time in accordance with the driving current than the light output p1 when no superposition is carried out (FIG. 4D). In consideration of the fact that the emitting light waveform slightly flags in connection with the time constant of the light emitting element 10 itself, if the driving current I2 is more enhanced by the effect of the shot pulse current as shown in FIG. 4C than the driving current i2 before the superposition, the emitting light waveform may be further improved.

Figure 5:
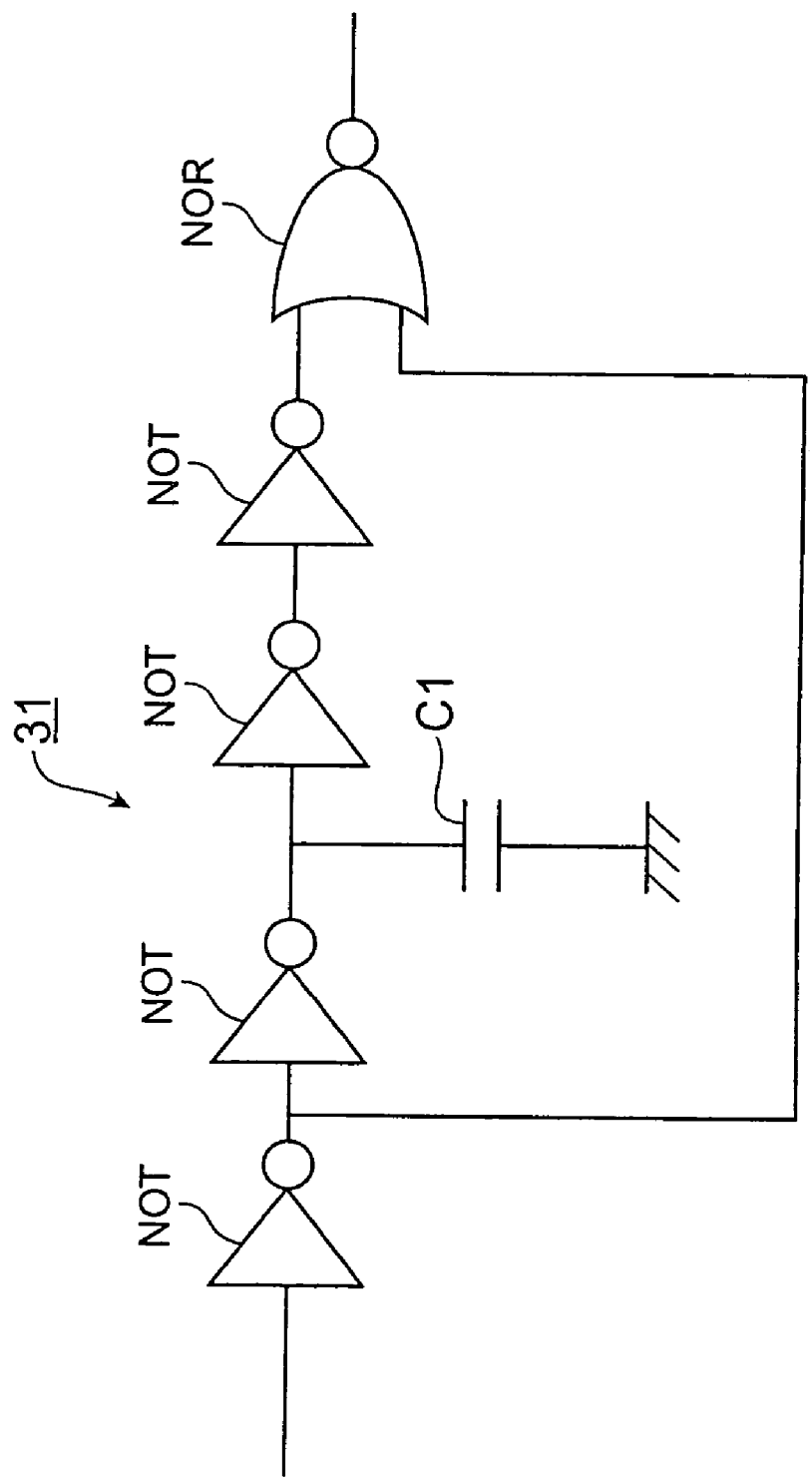
FIG. 5 is a circuit diagram showing a one-shot circuit 31 for outputting one shot pulse voltage at the rise-up time.

FIG. 5 is a circuit diagram showing a one-shot circuit 31 for outputting the shot pulse voltage at the rise-up time of the input pulse voltage.

Several inverting and amplifying circuits NOT are connected to one another in series from the input-side, and a capacitor C1 is inserted in parallel at some position of this connection passage, an NOR circuit is equipped with the final terminal of the inverting and amplifying circuit NOT. H represents a high level signal, and L represents a low level signal. The NOR circuit is a circuit for outputting "L" when "H" is input to at least one input terminal, that is, a circuit for outputting "H" only when "L" is input to both the input terminals.

With respect to the input of the NOR circuit, one input to the NOR circuit is set from "H" to "L" by the inverting circuit NOT during the initial stage at the rise-up time of the input pulse voltage (from L to H), and the other input of the NOR circuit before this input is "L," so that "H" is instantaneously output from the NOR circuit. When the charging of the capacitor C1 is started, the other input to the NOR circuit is set to "H," and thus the output of the NOR circuit is set to "L". As described above, the one-shot circuit 31 outputs the pulse voltage of "H" only at one moment.

In the circuit shown in FIG. 3, the transistor 32 is connected to the upstream side of the switch Q1, however, it may be connected to the downstream side of the switch Q1, that is, connected to the node point A.

Third Embodiment

Figure 6:
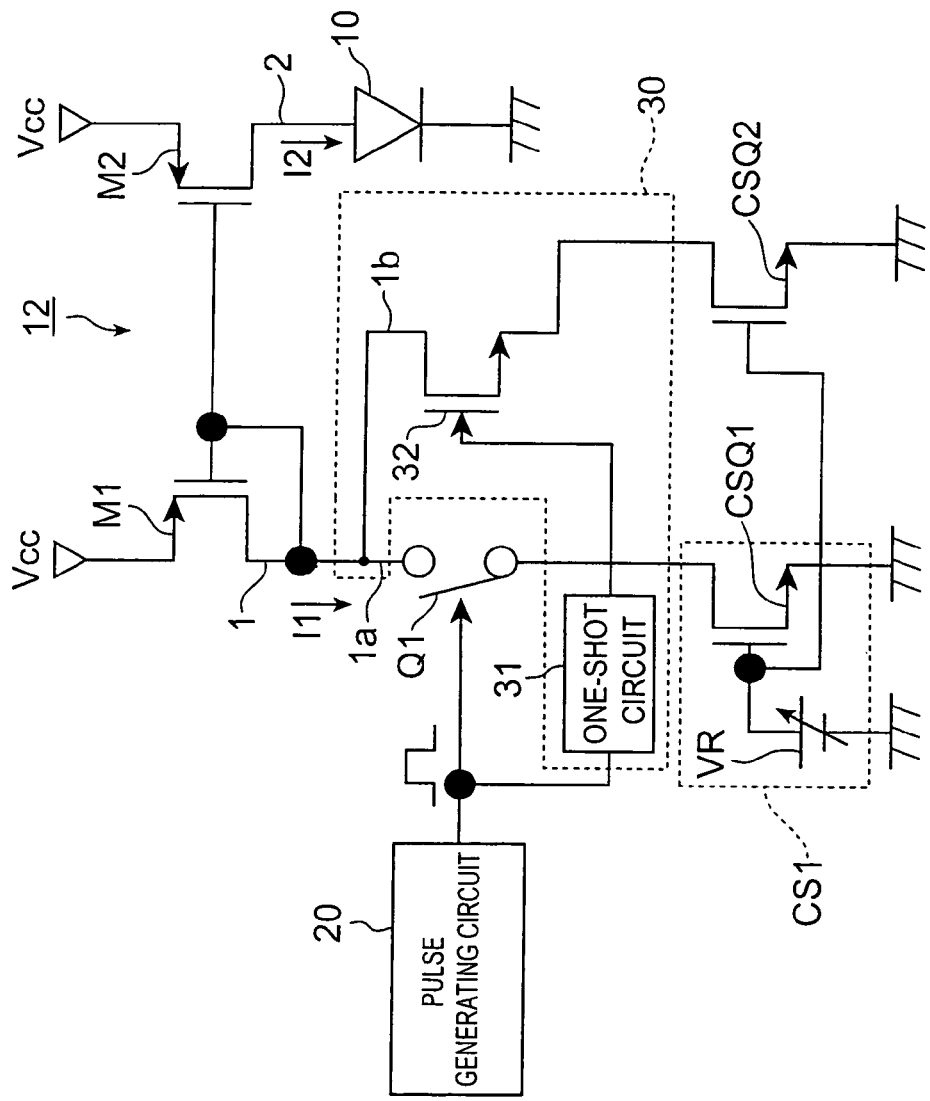
FIG. 6 is a circuit diagram showing a light emitting element driving circuit according to a third embodiment.

FIG. 6 is a circuit diagram showing a light emitting element driving circuit according to a third embodiment.

FIG. 7A is a timing chart of the output of a pulse generating circuit, FIG. 7B is a timing chart of the M1 and M2 gate charging current, FIG. 7C is a timing chart showing driving current, FIG. 7D is a timing chart of a light output, FIG. 7E is a timing chart of the output of the pulse generating circuit, FIG. 7F is a timing chart of the M1 and M2 gate charging current, FIG. 7G is a timing chart of the driving current, and FIG. 7H is a timing chart of the light output.

In this circuit, a current source (transistor CSQ2) is equipped at the downstream side of the transistor 32 of the superposing means 30 of the second embodiment.

That is, the downstream side of the other line 1 of the current mirror circuit 12 is branched, and one line 1a of the branched lines is connected to a first transistor CSQ1 (current source) for defining the current flowing through the line 1a. The superposing means 30 comprises a one-shot circuit 31 for outputting one shot pulse voltage in synchronization with the rise-up time of the pulse voltage output from the pulse generating circuit 20, and a second transistor 32 which has a control terminal supplied with the shot pulse voltage and is connected to the downstream side of the other line (1b) of the branched lines. A third transistor CSQ2 for defining the current flowing through the second transistor 32 is connected to the downstream side of the second transistor 32, and the control terminals (gates) of the first and third transistors CSQ1 and CSQ2 are mutually connected to each other.

The control terminals of the first and third transistors CSQ1 and CSQ2 are connected to each other. Therefore, when the voltage applied from the voltage source VR to one control terminal is varied, the voltage applied to the other control terminal is proportionally varied. The first transistor CSQ1 defines the current flowing through the line 1a branched from the other line 1 of the current mirror circuit 12, that is, the main pulse current, and the third transistor CSQ2 defines the auxiliary addition current generated by the shot pulse voltage, that is, the first auxiliary pulse current. Therefore, the main pulse current and the first auxiliary pulse current are varied while being maintained a proportional relationship with each other. That is, in this construction, when the driving current I2 is increased, the first auxiliary pulse current is prevented from being relatively reduced. This will be described hereunder.

FIG. 7A, FIG. 7E are timing charts showing the output voltage of the pulse generating circuit 20, FIG. 7B is a timing chart of the M1 and M2 gate charging current in the first embodiment, FIG. 7F is a timing chart of the M1 and M2 gate charging current in the third embodiment, FIG. 7C is a timing chart of driving current I2 in the first embodiment, FIG. 7G is a timing chart of driving current I2 in the third embodiment, FIG. 7D is a timing chart of the light output in the first embodiment, and FIG. 7H is a timing chart of the light output in the third embodiment.

In the construction of the first embodiment, the absolute value of the auxiliary pulse current is invariable, and thus when the main pulse current is increased, the attribution rate of the auxiliary pulse current is relatively reduced. In this case, as compared with a case where the driving current I2 is set to a low value, the rise-up time of the driving current I2 is relatively longer. It is a matter of course that the rise-up time of the light output is relatively longer.

On the other hand, in the construction of the third embodiment, the auxiliary pulse current is increased in proportion to the pulse current, and the auxiliary pulse current likewise contributes to the driving current I2 even when the main pulse current is increased. Accordingly, even when the driving current I2 is set to a high value, the rise-up time of the driving current I2 remains short, and the rise-up time of the light output also remains short.

In this embodiment, the voltage source VR is set as a variable voltage source. Accordingly, the magnitude of the driving current I2 can be switched as occasion demands. For example, the driving current I2 is increased during an operation of writing information into a CD-R at high speed, and it is reduced during an operation of writing information into a CD-R at low speed.

Fourth Embodiment

Figure 8:
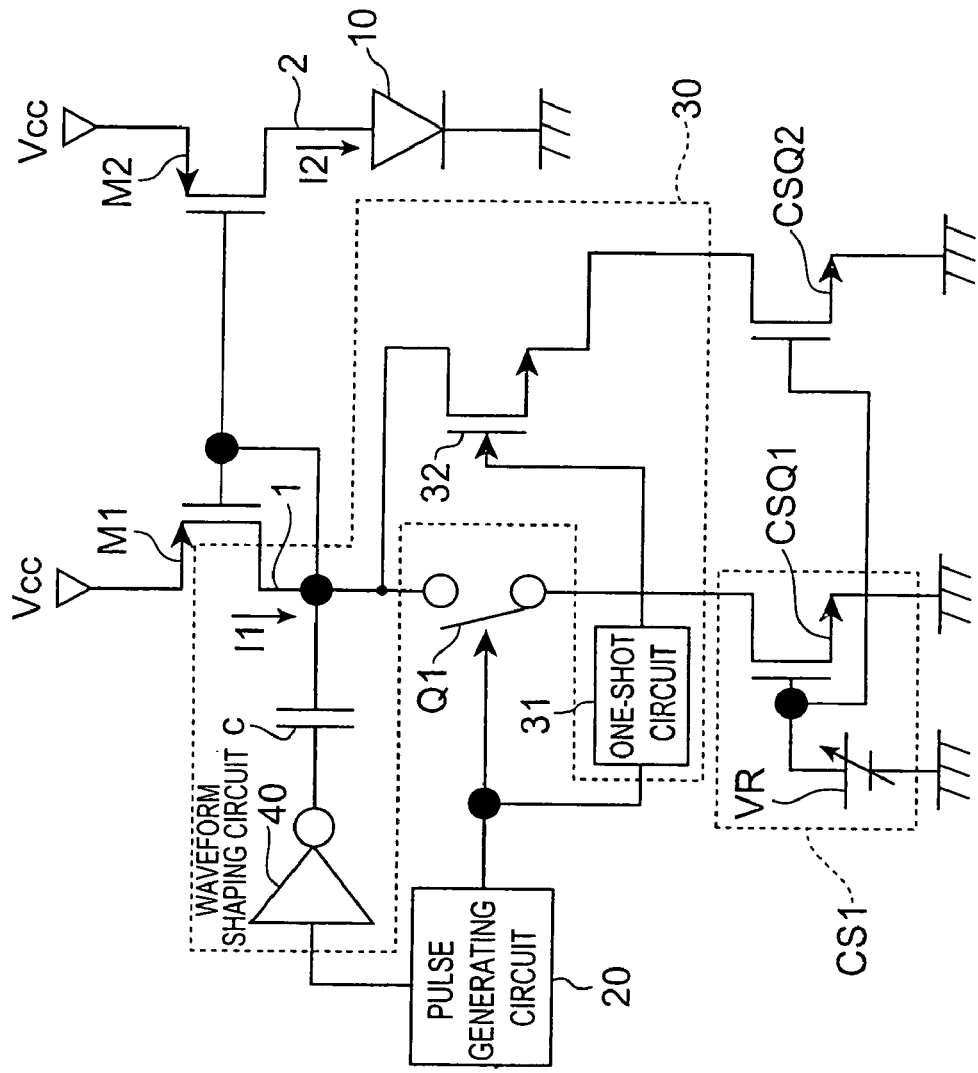
FIG. 8 is a circuit diagram showing a light emitting element driving circuit according to a fourth embodiment.

FIG. 8 is a circuit diagram showing a light emitting element driving circuit according to a fourth embodiment. In this circuit, the superposing means 30 of the third embodiment is added to the superposing means 30 of the first embodiment to form new superposing means 30 as a whole. Other construction is the same as the third embodiment.

FIG. 9A is a timing chart showing the output voltage of the pulse generating circuit 20, FIG. 9B is a timing chart of the M1 and M2 gate charging current, FIG. 9C is a timing chart of driving current i2 and I2 of LD, and FIG. 9D is a timing chart of the light outputs p1 and P1 before and after the superposition.

As compared with the driving circuit of the third embodiment, the effect of the superposing means 30 of the first embodiment, that is, the effect of shortening the rise-up time and falling time of the pulse current can be added, and the light emitting element 10 can be driven at high speed.

Fifth Embodiment

Figure 10:
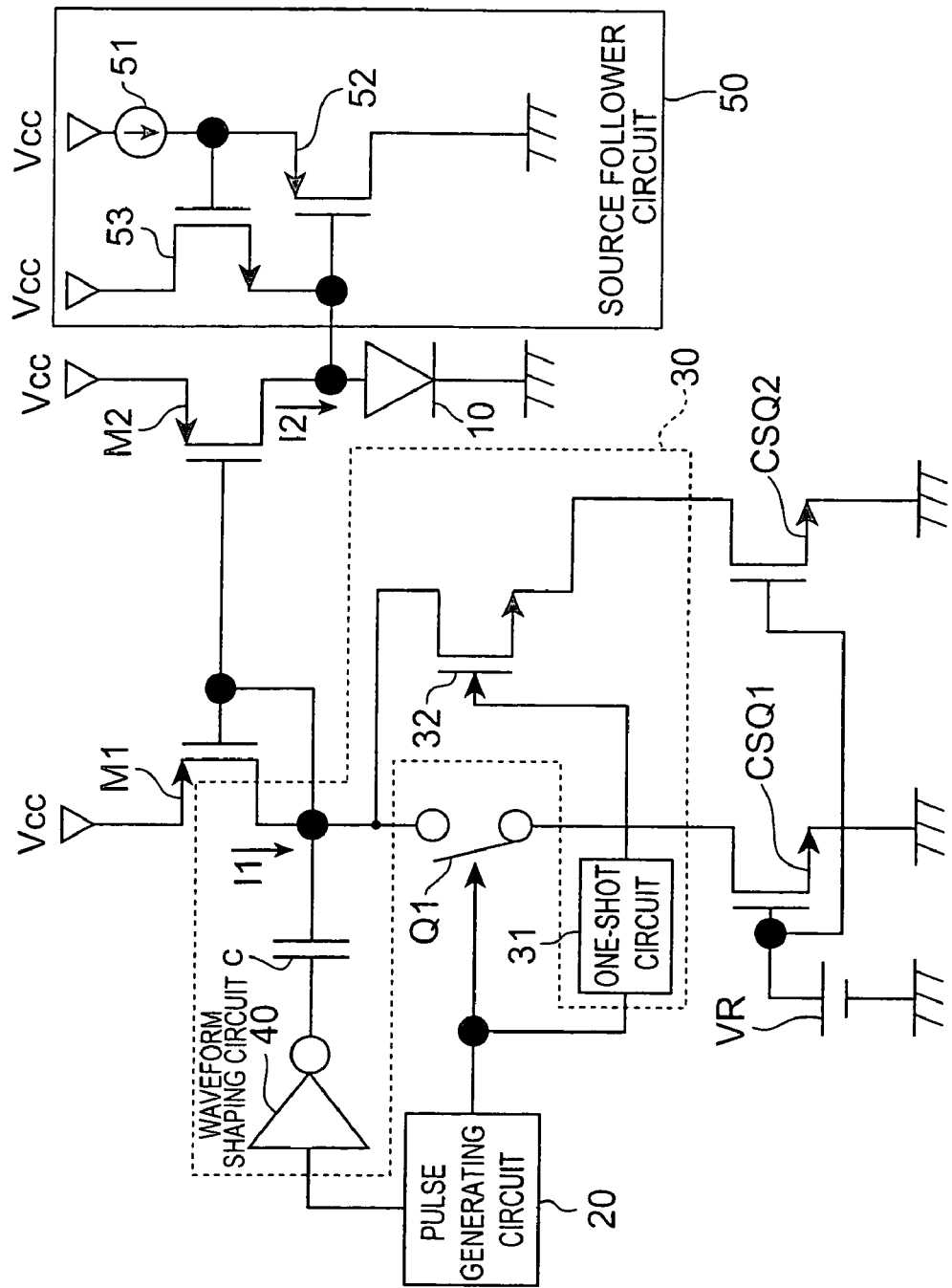
FIG. 10 is a circuit diagram showing a light emitting element driving circuit according to a fifth embodiment.

FIG. 10 is a circuit diagram showing a light emitting element driving circuit according to a fifth embodiment. In this circuit, a source follower circuit 50 is added to the upstream side of the light emitting element 10 in the driving circuit of the fourth embodiment.

The source follower circuit 50 is equipped with a P-channel type MOS electric field effect transistor 52 connected to the downstream side of the current source 51, and an N-channel MOS electric field effect transistor connected between the power source voltage Vcc and the gate of the P-channel MOS electric field effect transistor 52, and the gate of the N-channel MOS electric field effect transistor 53 is connected to the source of the P-channel MOS electric field effect transistor 52. In this circuit, the P-channel and N-channel MOS electric field effect transistors 52 and 53 have the same gate-source voltage, and can control the Q-value of the circuit. That is, if the Q value is lowered by using a proper circuit constant, oscillation is suppressed in the driving current.

Figure 11A:
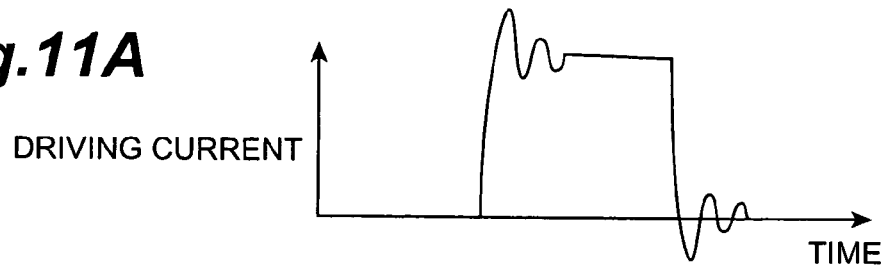
FIG. 11A is a timing chart of M1 and M2 gate changing output.
Figure 11B:
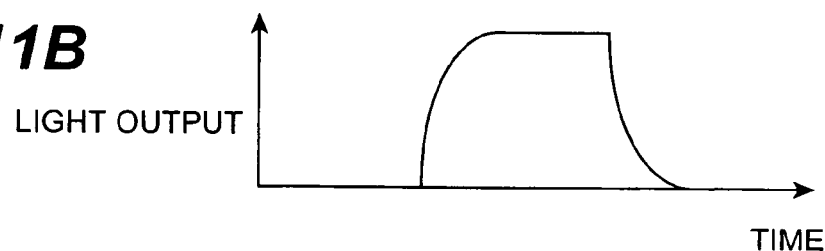
FIG. 11B is a timing chart of a light output.
Figure 11C:
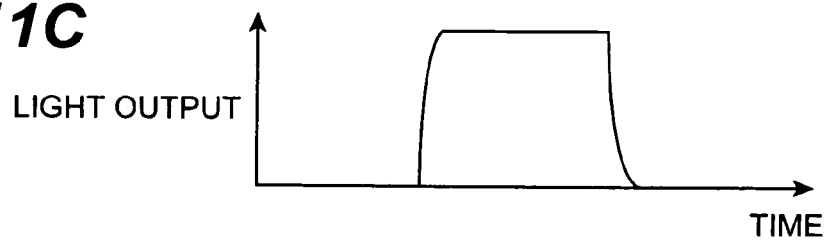
FIG. 11C is a timing chart of a light output.

FIG. 11A is timing chart of M1 and M2 gate charging current, while FIG. 11B and FIG. 11C are timing charts of the light output.

When the pulse driving speed is increased (the rise-up time and the falling time are set to about 1 ns), severe ringing (oscillation) is liable to be induced in accordance with the relationship between the output terminal capacitance and the wiring inductance from the output terminal of the IC containing the driving circuit concerned to the light emitting element 10 (FIG. 11A). The circuit cannot be practically used under the ringing state. Therefore, it has been believed that the waveform must be finally flagged by adding a snubber circuit, etc., to the output terminal in order to suppress ringing (FIG. 11B). However, in this embodiment, by adding the source follower circuit 50, an ideal output waveform can be achieved without ringing while very high-speed rise-up and falling are implemented (FIG. 11C).

That is, the light emitting element 10 is liable to suffer oscillation during the high-speed driving operation. However, since the source follower circuit 50 described above is connected to the one line 2 of the current mirror circuit 12, the oscillation caused by the variation of the driving current I2 can be suppressed and the light emitting element 10 can be stably driven at high speed. The DC current from the current source 51 is supplied to the light emitting element 10 at all times.

In any embodiment described above, the DC current may be supplied to the light emitting element 10 in advance to enhance the response characteristics.

Sixth Embodiment

Figure 12:
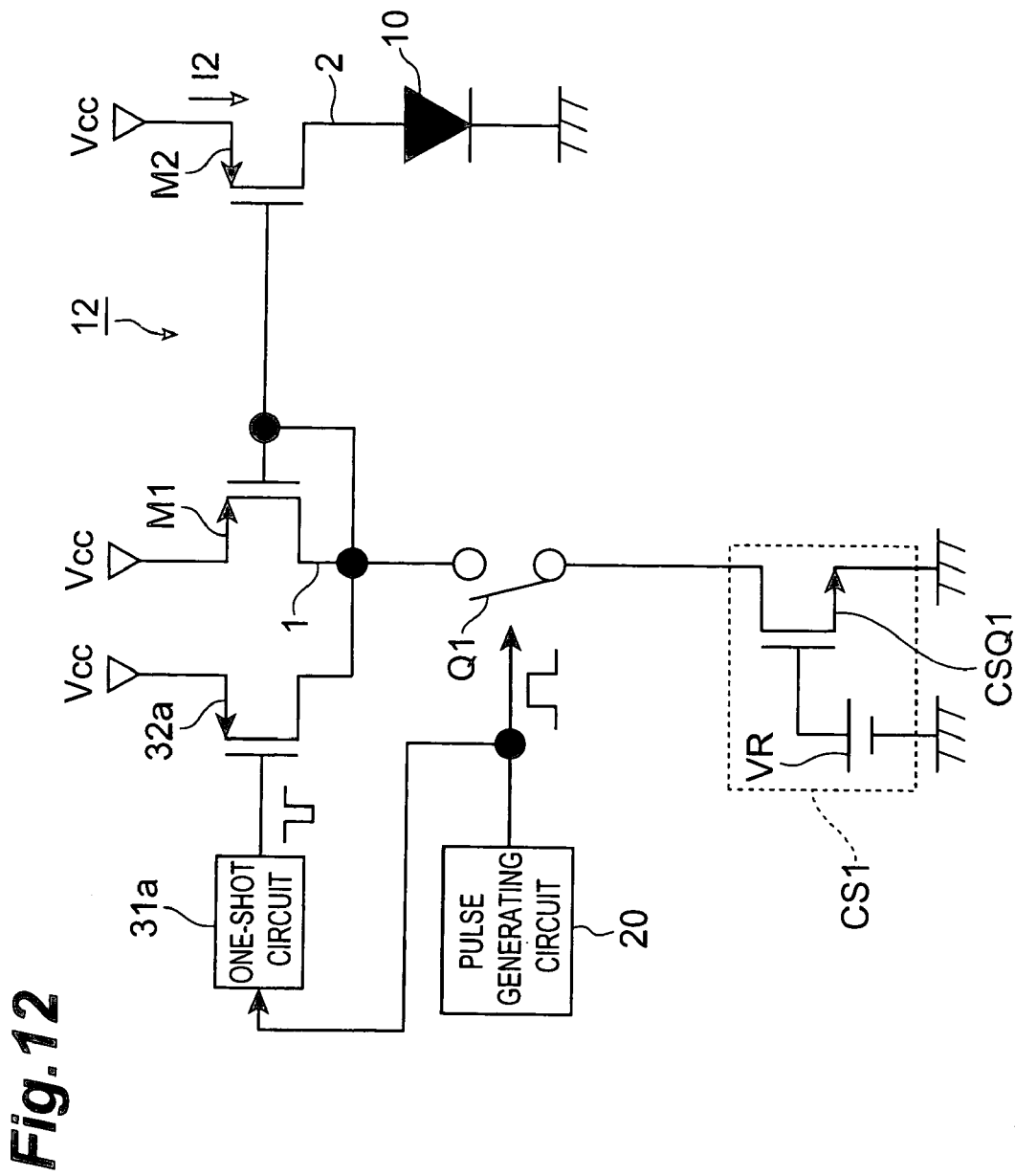
FIG. 12 is a circuit diagram showing a light emitting element driving circuit according to a sixth embodiment.

FIG. 12 is a circuit diagram showing a light emitting element driving circuit according to a sixth embodiment. The light emitting element driving circuit of this embodiment is different from the light emitting element driving circuit of the second embodiment in that a one-shot circuit 31a is used in place of the one-shot circuit 31. The one-shot circuit 31a outputs one shot pulse voltage at the falling time of the main pulse current. The effective falling time of the current flowing through the line 1 in synchronization with the input of the shot pulse voltage is shortened.

The light emitting element driving circuit is equipped with a transistor 32a for controlling the current amount between the drain of the transistor M1 and the power source potential Vcc. The transistor 32a is a P-type MOS electric field effect transistor, and it is conducted by a low level voltage input to the gate.

The transistor 32a is turned on only for a moment at the falling time of the main pulse current flowing through the line 1 before the shot pulse voltage is input to the transistor 32a, so that the charges accumulated in the capacitor between the gate and source of the transistors M1 and M2 are quickly discharged and the driving current I2 is quickly reduced. That is, the negative second auxiliary pulse current ΔiR flowing in the opposite direction to the pulse current before the superposition is generated by the transistor 32a. As a result, the output current to the light emitting element 10 falls sharply, and the light output also falls quickly. This construction may be combined with the light emitting element driving circuit described above.

Figure 13:
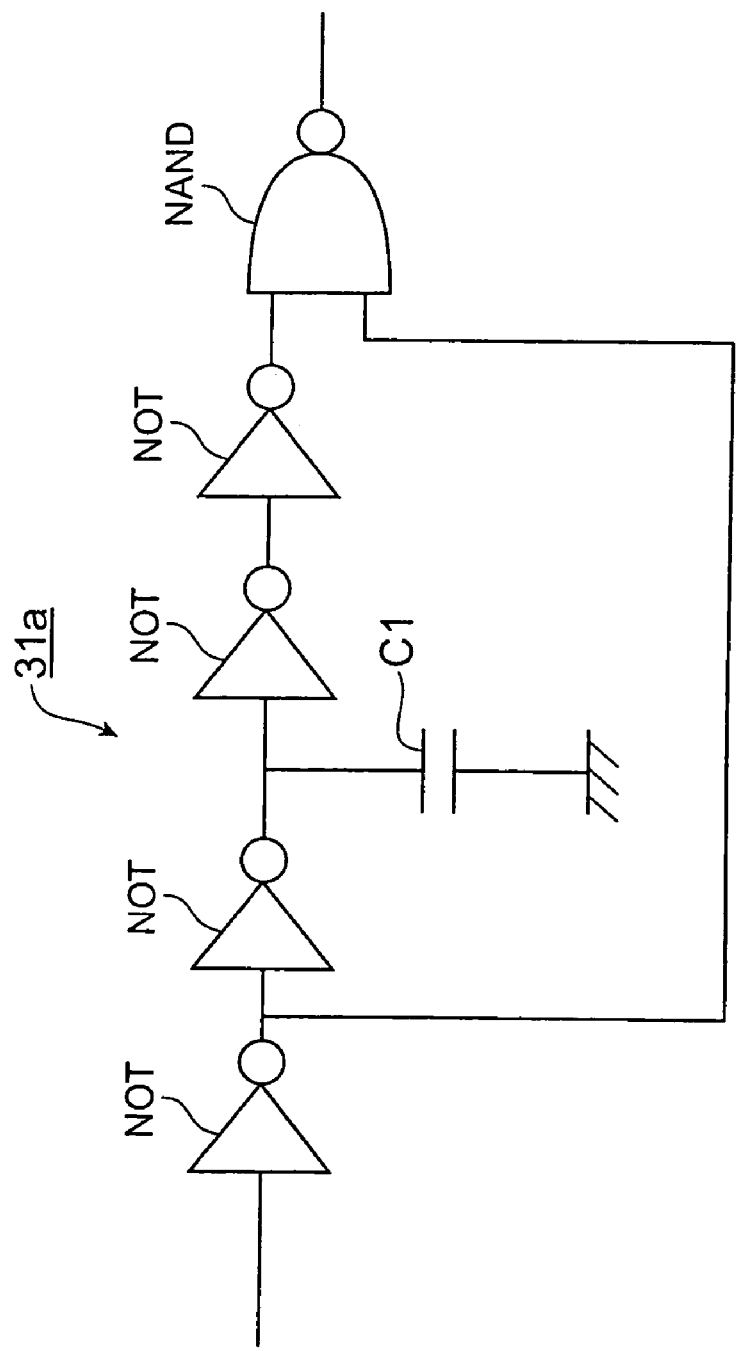
FIG. 13 is a circuit diagram showing a one-shot circuit 31a for outputting one shot pulse voltage at the falling time.

FIG. 13 is a circuit diagram of a one-shot circuit for outputting one shot pulse voltage when the pulse current before the superposition falls. The one shot circuit 31a is different from the one shot circuit 31 shown in FIG. 5 in that the output of the NOT circuit at the last stage as well as the output of the NOT circuit at the first stage is input to the NAND circuit. When one pulse voltage is applied to the one shot circuit 31a, a low level voltage is output from the NAND circuit in synchronization with the falling time of the pulse voltage. The circuit construction for increasing the speed of the response characteristics at the falling time may be combined with the circuit of any embodiment described above.

The light emitting element driving circuit shown in FIG. 15 uses the source follower circuit, and a method of controlling the current flowing through the source follower circuit 50 with an input signal will be described hereunder.

Figure 14:
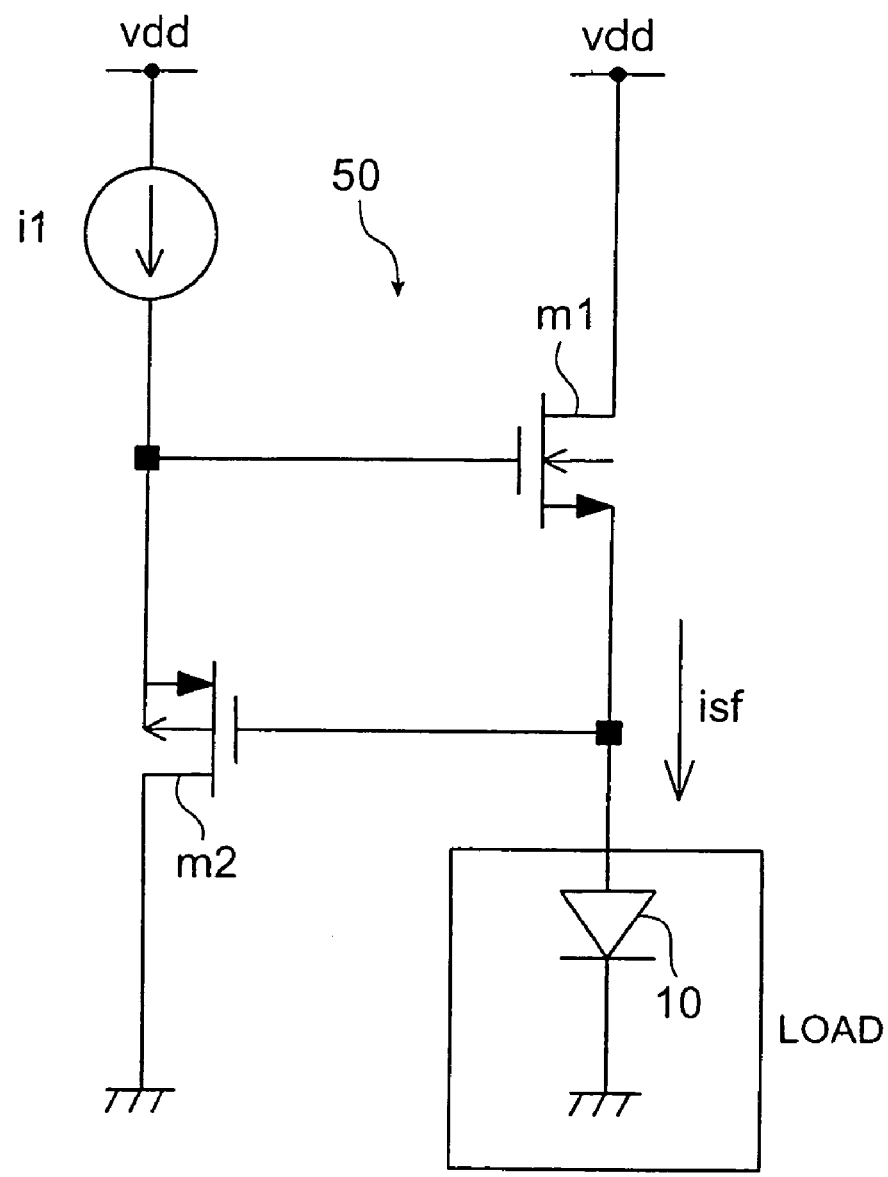
FIG. 14 is a circuit diagram showing a basic source follower circuit which has been hitherto well known.

FIG. 14 is a circuit diagram showing a basic source follower circuit 50 which is well known. The source follower circuit 50 shown in FIG. 10 is such a circuit. FIG. 19A is a graph showing the relationship between the input voltage vin and the output isf, FIG. 19B is a graph showing the relationship between the input voltage vin and the output ir, FIG. 19C is a graph showing the input voltage vin and the output iL, FIG. 19D is a graph showing the relationship between the input voltage vin and the output isf, FIG. 19E is a graph showing the relationship between the input voltage vin and the output ir, and FIG. 19F is a graph showing the relationship between the input voltage vin and the output iL.

Representing a constant current source by i1, current flowing through the constant current source i1 flows through a P-MOS type transistor m2 to the ground. This current is proportional to current supplied from the power source Vdd through the N-MOS type transistor m1 to the load 10. That is, the voltage between the source and gate of the P-MOS type transistor m2 is equal to the voltage between the source and gate between the N-MOS type transistor, and the currents flowing through these transistors are proportional to each other, and also the variation of the Q-value is reduced by adopting such a circuit for the light emitting element driving circuit. In this case, the source follower current isf supplied from the source follower circuit 50 to the light emitting element 10 is set to a fixed value (see FIG. 19A).

The light emitting element driving circuit described above is applicable to players for CD-R, CD-RW, DVD-R, DVD-RW, etc. In these players, current is supplied to the light emitting element 10 at the signal reading time. A path to which the driving current is supplied at the signal reading time is set as a read channel.

Figure 15:
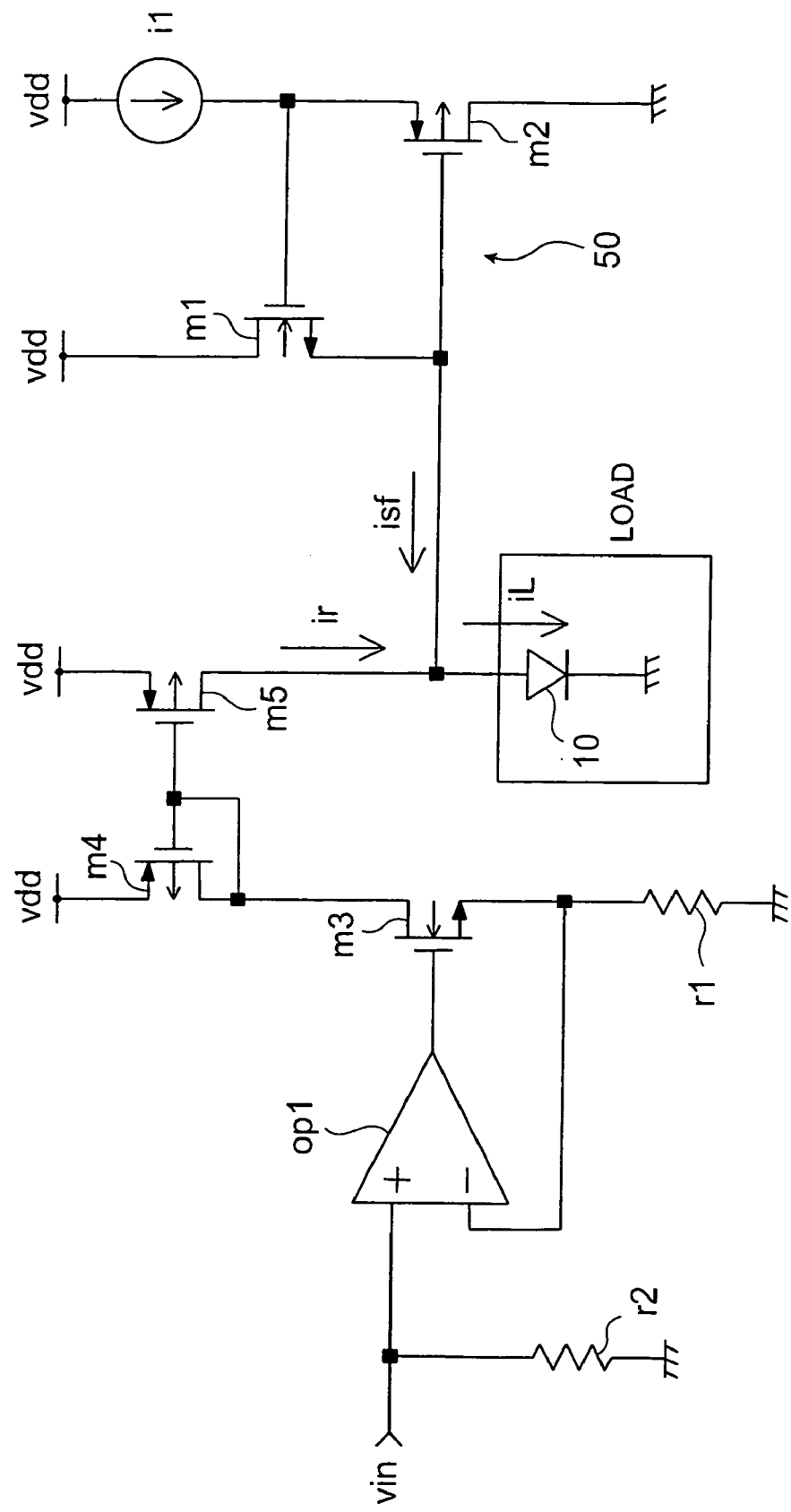
FIG. 15 is a circuit diagram showing a light emitting element driving circuit in which the source follower circuit shown in FIG. 14 is connected to a read channel.

FIG. 15 is a circuit diagram showing the light emitting element driving circuit in which the source follower circuit 50 shown in FIG. 14 is connected to the read channel. The light emitting element 10 is supplied with read current ir and source follower current isf. The read current ir is a current flowing from a power source Vdd through one line of a current mirror circuits having two parallel lines. This one line is a path for current flowing through the channel of the P-MOS type transistor m5. The other line of the current mirror circuit is connected from the power source Vdd through the P-MOS type transistor m4, the P-MOS type transistor m3 and the resistor r1. The current flowing through the current mirror circuit can be controlled by controlling the voltage (gate-source voltage) applied to the gate of the transistor m3.

The gate of the transistor m3 is connected to the output terminal of an operational amplifier op1. Therefore, when the input voltage vin is input to the non-inverted input terminal of the operation amplifier op1, the output terminal potential of the operational amplifier op1 is increased, the current flowing through the other line of the current mirror circuit is increased, and the current proportional to the above current flows as the read current ir to the one line. When the current flowing through the transistor m3 is increased, the current flowing through the resistor r1 is increased, and the source potential rises up to reduce the gate-source voltage. In addition, the instantaneous voltage between the inverted input terminal and non-inverted input terminal of the operational amplifier op1 is also reduced. Therefore, the increase of the current flowing through the other line by the operational amplifier op1 suffers feedback, and the read current is linearly increased with respect to the input voltage (see FIG.

19B). A resistor r2 is connected between the non-inverted output terminal of the operation amplifier op1.

The current iL supplied to the light emitting element 10 as a load is a read current ir shown in FIG. 19B and an addition current of a source follower current isf. The read current ir is controlled by the input voltage vin, however, the source follower current isf is not controlled by the input voltage vin. Therefore, as shown in FIG. 19C, even when the input voltage vin is equal to 0V, the output current iL contains the source follower current isf having a fixed level. Even when such a current is supplied in advance, there is no problem, however, it is preferable to reduce the source follower current isf in accordance with the input voltage vin in order to reduce needless power consumption.

Prior to the description of the circuit thus constructed, the source follower circuit 50 for varying the source follower current isf independently of the input voltage vin will be described.

Figure 16:
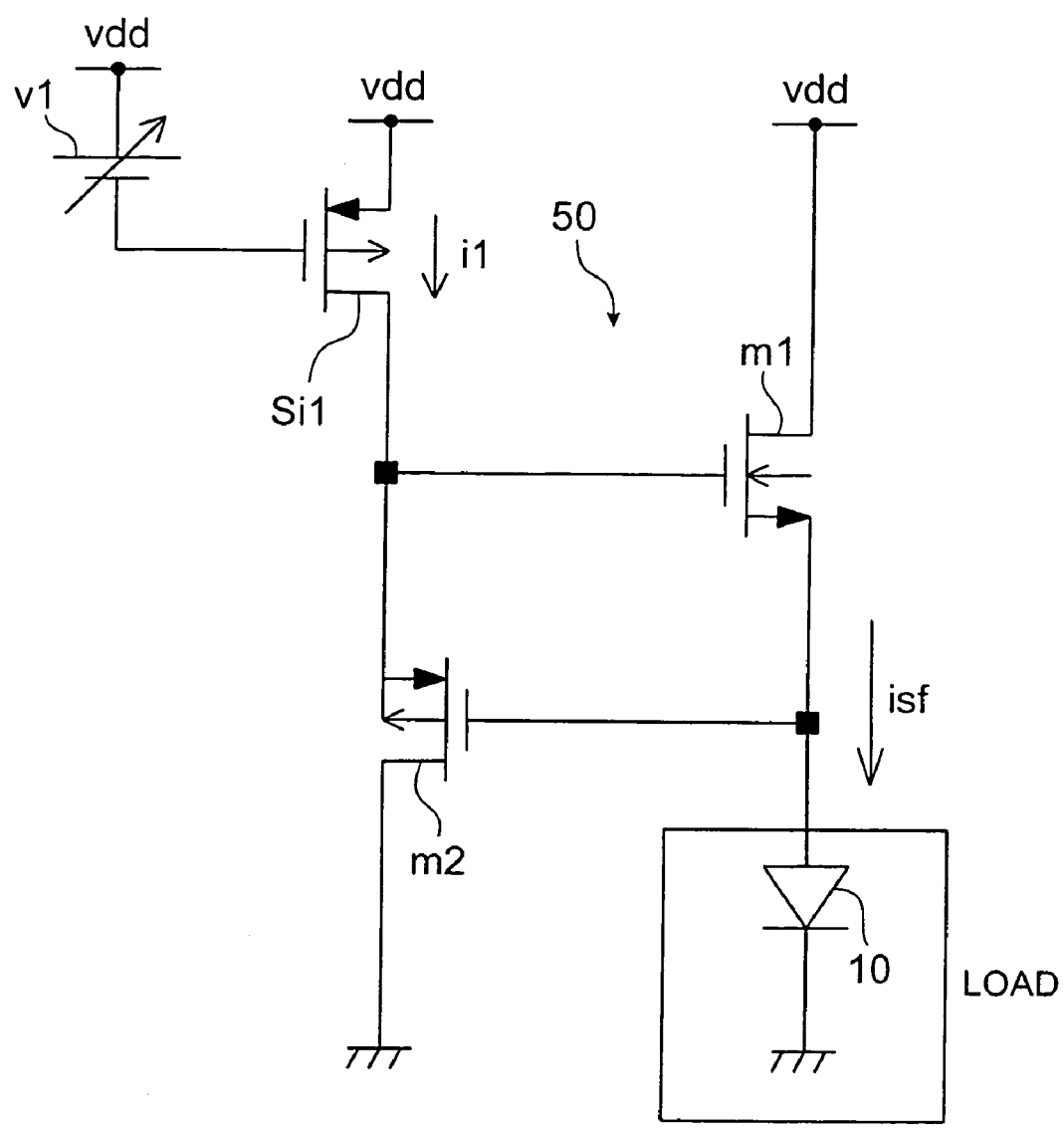
FIG. 16 is a circuit diagram showing a light emitting element driving circuit achieved by adding a transistor m2 of the light emitting element driving circuit shown in FIG. 14 with a current source Si1 for supplying variable current i1.

FIG. 16 is a circuit diagram showing a light emitting element driving circuit added with a current source Si1 for supplying variable current i1 to the transistor m2 of the light emitting element driving circuit shown in FIG. 14. The source follower current isf and the variable current i1 are substantially in a proportional relationship with each other in a practical current range. The variable current i1 of the current source Si1 comprising the P-MOS type transistor can be controlled by adjusting the output voltage of the variable power source v1 for controlling the gate potential of the P-MOS type transistor. By combining the source follower circuit 50 described above with any light emitting element driving circuit described above, the source follower current isf can be varied.

Next, a source follower circuit in which the source follower current isf is varied interlockingly with the input voltage vin will be described.

Figure 17:
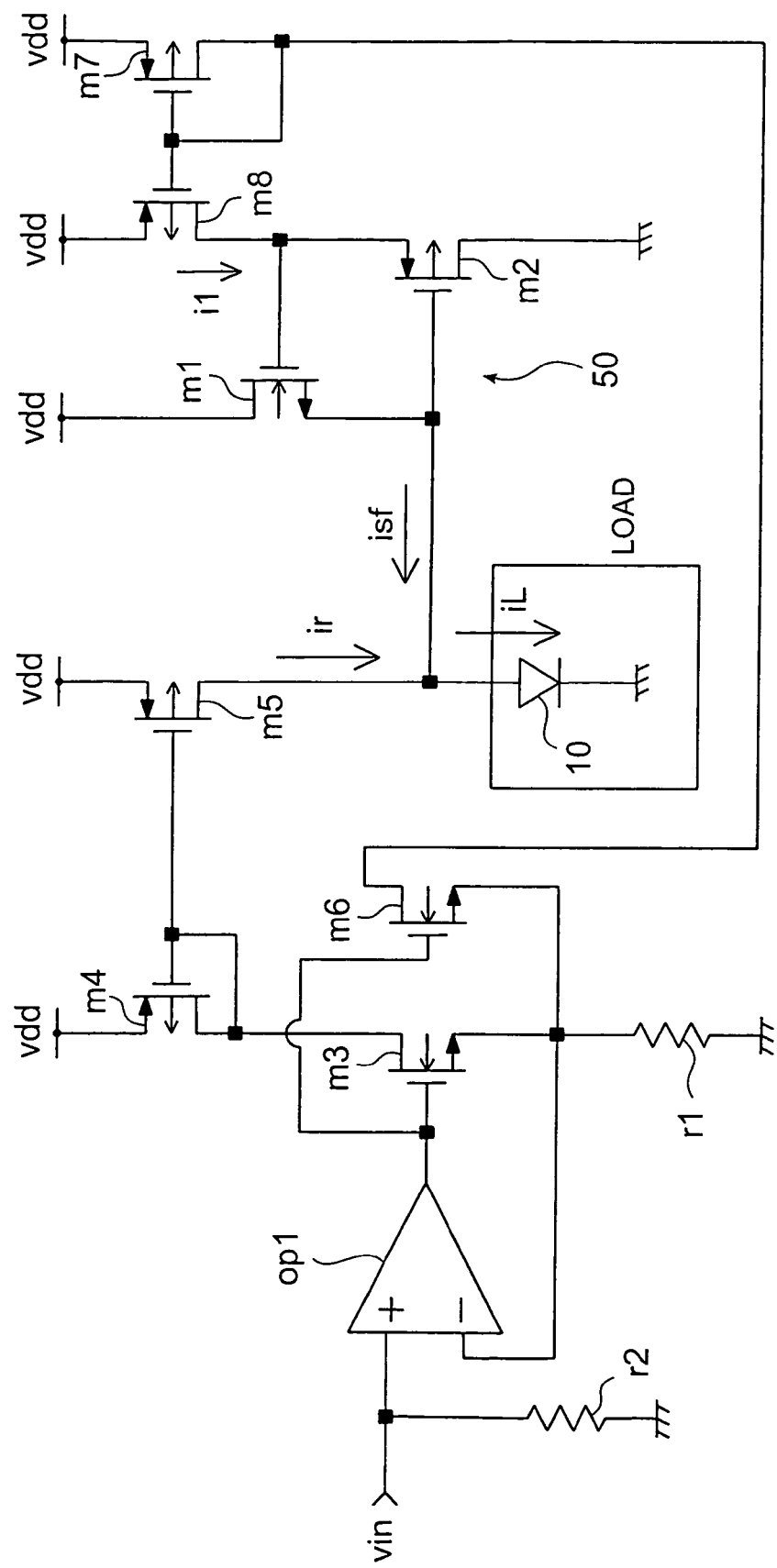
FIG. 17 is a circuit diagram showing a light emitting element driving circuit.

FIG. 17 is a circuit diagram showing a light emitting element driving circuit having such a function. It is different from the light emitting element driving circuit shown in FIG. 15 in that the current source il is constructed by a current mirror circuit 50 comprising two transistors m7 and m8, and in that the transistor m6 is connected to the input-side transistor m7 in series, the transistor m6 is connected to the transistor m3 in parallel, and the same voltage as m3 is input to the gate of the transistor m6. The current flowing through the transistor m6 is proportional to the transistor size ratio thereof to the transistor m3.

The current flowing through the transistor m3 is proportional to the current ir supplied to the light emitting element 10, and these currents are proportional to the input voltage vin. The current flowing through the transistor m3 is proportional to the input voltage vin, so that the current flowing through the transistor m6 is proportional to the input voltage vin, the current flowing through the transistor m8 of the current mirror circuit which is paired with the transistor m6 is proportional to the input voltage vin, and the source follower current isf of the source follower circuit 50 using the current mirror circuit as the current source is proportional to the input voltage vin (see FIG. 19D and FIG. 19E).

The current iL flowing through the light emitting element 10 as a load is equal to the sum of the variable current ir and the source follower current isf, and thus the current iL is proportional to the input voltage vin as shown in FIG. 19F.

The transistor m7 is a P-MOS type, and the drain thereof is connected to the drain of the N-MOS type transistor m6. The transistor m8 is also a P-MOS type. The node point of the downstream side of the transistor m6 corresponds to the node point between the downstream side of the transistor m3 and the resistor r1, and both the current flowing through the transistor m6 and the current flowing through the transistor m3 flow through the resistor r1, and in connection with the increase of these currents, the potential of the node point rises, and excessive increase of the current can be suppressed.

Figure 18:
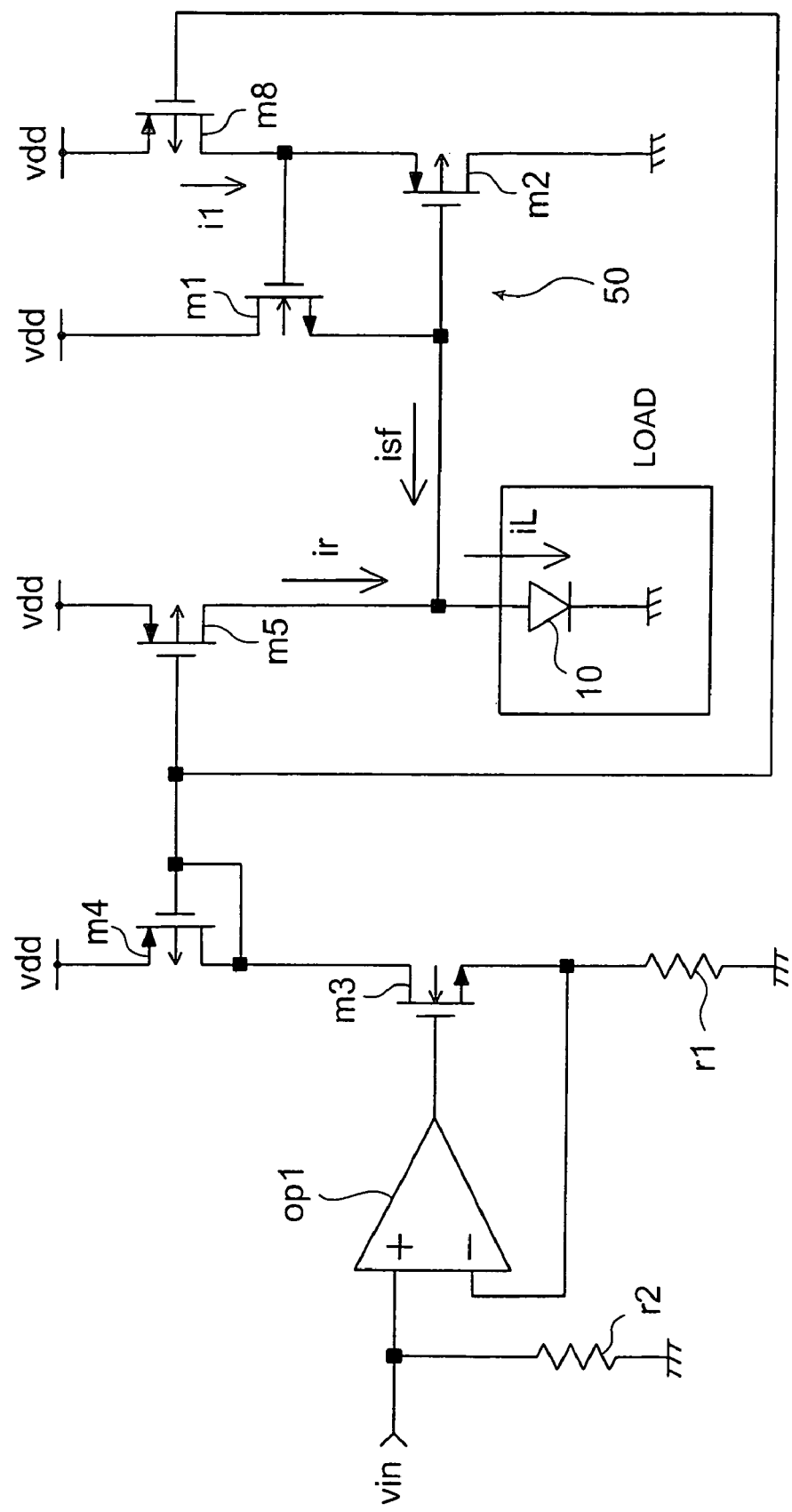
FIG. 18 is a circuit diagram showing a light emitting element driving circuit having the same function as FIG. 17.

FIG. 18 is a circuit diagram of a light emitting element driving circuit having the same function as FIG. 17. In this circuit, the transistor m7 shown in FIG. 17 is substituted by the transistor m4. In this case, the transistor m6 is common to the transistor m3, and thus it is naturally necessarily omitted.

According to the circuit of FIG. 18 and FIG. 19A to FIG. 19F, when the input vin is equal to 0(V), the load current iL can be set to 0(A). Furthermore, a user is not required to pay attention to the source follower current isf, and thus the circuit design using this circuit is easily performed.

When the circuit shown in FIG. 17 or 18 and the circuit containing the one-shot circuit described above are combined with each other, a current supplying current source (transistor m3) is connected to the input-side line of the current mirror circuit for supplying current to the light emitting element 10, and the respective circuits may be connected to one another so that the current flowing through the source follower circuit is proportional to the current flowing through the above current source.

For example, in the case of the circuit shown in FIG. 10, the source follower circuit 50 may be connected so that the transistor CSQ1 is the transistor m3. In this case, the amplitude of the pulse current supplied to the light emitting element 10, that is, the pulse height value can be determined by controlling the transistor m3. When the transistor m3 is connected as a different element to the transistor CSQ1 in parallel, the DC level of the pulse current supplied to the light emitting element 10 can be determined.

As described above, it is preferable that the light emitting element driving circuit shown in FIG. 17 and FIG. 18 is equipped with a source follower circuit 50 connected to one line (a line at the transistor M2 side: see FIG. 10) of the current mirror circuit, and a current setting circuit (m8, m7, m6, m3, op1, r1, r2) for setting the current so that the current flowing through the source follower circuit 50 is substantially proportional to the current flowing through the other line (a line at the transistor M1 side: see FIG. 10) of the current mirror circuit. Here, "substantially" means that it does not conform with a strict theoretical equation, and the relationship may be displaced by several percentages. In this case, by carrying out only the setting in the current setting circuit, the current ir supplied from the current mirror circuit to the light emitting element 10 and the current isf supplied from the source follower circuit 50 can be made to be substantially proportional to each other. That is, when the current supplied from the current mirror circuit to the light emitting element 10 is substantially equal to zero, the current supplied from the source follower circuit to the light emitting element 10 is substantially equal to zero.

Furthermore, the current setting circuit has the current controlling transistor m3 equipped to the other line of the current mirror circuit, and the transistor m3 and the source follower circuit 50 are connected to each other so that the current source m8 for supplying current to the source follower circuit 50 is controlled by the input to the control terminal of the transistor m3 (the gate in the electric field effect transistor, the base in the bipolar transistor), and the construction of the circuit is simple.

According to the light emitting element driving circuit of the present invention, the light emitting element can be driven at high speed.

What is claimed is:

1. A light emitting element driving circuit for supplying driving current to a light emitting element connected to one line of a current mirror circuit having two parallel lines, comprising:
    a pulse generating circuit connected to the other line so that pulse current flows through the other line; and
    superposing means for superposing first auxiliary pulse current on the pulse current in synchronization with the rise-up time of the pulse current,
    wherein the pulse generating circuit generates a pulse voltage for controlling a switch connected to the other line in series,
    wherein the superposing means comprises a differentiation circuit for differentiating a pulse voltage output from the pulse generating circuit and inputting the pulse voltage thus differentiated to the other line, and
    wherein the first auxiliary pulse current is generated in accordance with the output of the differentiation circuit.

2. A light emitting element driving circuit for supplying driving current to a light emitting element connected to one line of a current mirror circuit having two parallel lines, comprising:
    a pulse generating circuit connected to the other line so that pulse current flows through the other line; and
    superposing means for superposing first auxiliary pulse current on the pulse current in synchronization with the rise-up time of the pulse current,
    wherein the pulse generating circuit generates a pulse voltage for controlling a switch connected to the other line in series, and
    wherein the superposing means comprises a one-shot circuit for outputting one shot pulse voltage in synchronization with the rise-up time of the pulse voltage, and a transistor which has a control terminal supplied with the shot pulse voltage and is connected to the downstream side of the other line.

3. A light emitting element driving circuit for supplying driving current to a light emitting element connected to one line of a current mirror circuit having two parallel lines, comprising:
    a pulse generating circuit connected to the other line so that pulse current flows through the other line; and
    superposing means for superposing first auxiliary pulse current on the pulse current in synchronization with the rise-up time of the pulse current,
    wherein the pulse generating circuit generates a pulse voltage for controlling a switch connected to the other line in series,
    the downstream side of the other line is branched, one of the branched lines is connected to a first transistor for defining current flowing through the other line,
    the superposing means comprises:
    a one-shot circuit for outputting a one shot pulse voltage in synchronization with the rise-up time of the pulse voltage,
    a second transistor which has a control terminal supplied with the shot pulse voltage and is connected to the downstream side of the other line of the branched lines,
    a third transistor for defining current flowing through the second transistor is connected to the downstream side of the second transistor, and
    the control terminals of the first and third transistors are mutually connected to each other.

4. A light emitting element driving circuit for supplying driving current to a light emitting element connected to one line of a current mirror circuit having two parallel lines, comprising:
    a pulse generating circuit connected to the other line so that pulse current flows through the other line; and
    superposing means for superposing first auxiliary pulse current on the pulse current in synchronization with the rise-up time of the pulse current,
    wherein a source follower circuit is connected to one line of the current mirror circuit.

5. A light emitting element driving circuit for supplying driving current to a light emitting element connected to one line of a current mirror circuit having two parallel lines, comprising:
    a pulse generating circuit connected to the other line so that pulse current flows through the other line;
    superposing means for superposing first auxiliary pulse current on the pulse current in synchronization with the rise-up time of the pulse current;
    a source follower circuit connected to the one line of the current mirror circuit, and
    a current setting circuit for setting current so that the current flowing through the source follower circuit is substantially proportional to current flowing through the other line of the current mirror circuit.

6. The light emitting element driving circuit according to claim 5,
    wherein the current setting circuit has a current controlling transistor equipped to the other line of the current mirror circuit, and the transistor and the source follower circuit are connected to each other so that the current source for supplying current to the source follower circuit is controlled by an input to the control terminal of the transistor.

7. A light emitting element driving circuit for supplying driving current to a light emitting element connected to one line of a current mirror circuit having two parallel lines, comprising:
    a pulse generating circuit connected to the other line so that pulse current flows through the other line; and
    superposing means for superposing first auxiliary pulse current on the pulse current in synchronization with the rise-up time of the pulse current,
    wherein the source of said first or second auxiliary pulse current from said superposing means is connected to the gate of a transistor that forms the other line of said current mirror circuit.

8. The light emitting element driving circuit according to one of claims 1, 2, 3, 5 and 7,
    wherein the downstream side of the other line is connected to a current source for defining current flowing through the other line.

9. The light emitting element driving circuit according to one of claims 1, 2, 3, 4, 5 and 7,
    wherein said superposing means superposes second auxiliary pulse current on the pulse current in synchronization with the falling time of the pulse current.

10. The light emitting element driving circuit according to claim 9,
    wherein the second auxiliary pulse current is negative.

* * * * *